United States Patent
Sugahara et al.

(10) Patent No.: US 7,528,428 B2
(45) Date of Patent: May 5, 2009

(54) FIELD-EFFECT TRANSISTOR WITH SPIN-DEPENDENT TRANSMISSION CHARACTERISTICS AND NON-VOLATILE MEMORY USING THE SAME

(75) Inventors: Satoshi Sugahara, Kanagawa (JP); Masaaki Tanaka, Saitama (JP)

(73) Assignee: Japan Science and Technology Agency, Saitama (JP)

( * ) Notice: Subject to any disclaimer, the term of this patent is extended or adjusted under 35 U.S.C. 154(b) by 0 days.

(21) Appl. No.: 10/547,844

(22) PCT Filed: Jan. 23, 2004

(86) PCT No.: PCT/JP2004/000567

§ 371 (c)(1),
(2), (4) Date: Sep. 2, 2005

(87) PCT Pub. No.: WO2004/079827

PCT Pub. Date: Sep. 16, 2004

(65) Prior Publication Data

US 2006/0138502 A1    Jun. 29, 2006

(30) Foreign Application Priority Data

Mar. 7, 2003 (JP) .............................. 2003-062453
Jun. 9, 2003 (JP) .............................. 2003-164398

(51) Int. Cl.
*H01L 29/78* (2006.01)
(52) U.S. Cl. ............................... 257/295; 257/E29.272
(58) Field of Classification Search .................. None
See application file for complete search history.

(56) References Cited

U.S. PATENT DOCUMENTS 5,416,353 A    5/1995    Kamiguchi et al.

(Continued)

FOREIGN PATENT DOCUMENTS

JP    A 10-284765    10/1998

(Continued)

OTHER PUBLICATIONS

Supriyo Datta et al: "Electronic analog of the electro-optic modulator" Applied Physics Letters, AIP, American Institute of Physics, Melville, NY, US, vol. 56, No. 7, Feb. 12, 1990, pp. 665-667, XP000126701.

Schmidt G et al: "Spin injection into semiconductors, physics and experiments" Semiconductor Science and Technology, IOP, Bristol, GB, vol. 17, No. 4, Apr. 2002, pp. 310-321, XP002210978.

(Continued)

*Primary Examiner*—Evan Pert
*Assistant Examiner*—Ben P Sandvik
(74) *Attorney, Agent, or Firm*—Oliff & Berridge, PLC

(57) ABSTRACT

When a gate voltage $V_{GS}$ is applied, the Schottky barrier width due to the metallic spin band in the ferromagnetic source is decreased, and up-spin electrons from the metallic spin band are tunnel-injected into the channel region. However, down-spin electrons from the nonmagnetic contact (3b) are not injected because of the energy barrier due to semiconductive spin band of the ferromagnetic source (3a). That is, only up-spin electrons are injected into the channel layer from the ferromagnetic source (3a). If the ferromagnetic source (3a) and the ferromagnetic drain (5a) are parallel magnetized, up-spin electrons are conducted through the metallic spin band of the ferromagnetic drain to become the drain current. Contrarily, if the ferromagnetic source (3a) and the (ferromagnetic drain (5a) are antiparallel magnetized, up-spin electrons cannot be conducted through the ferromagnetic drain (5a) because of the energy barrier Ec due to the semiconductive spin band in the ferromagnetic drain (5a). Thus, a high-performance high-degree of integration nonvolatile memory composed of MISFETs operating on the above operating principle can be fabricated.

52 Claims, 11 Drawing Sheets

U.S. PATENT DOCUMENTS

| | | | |
|---|---|---|---|
| 5,654,566 A * | 8/1997 | Johnson | 257/295 |
| 6,355,953 B1 * | 3/2002 | Kirczenow | 257/295 |
| 6,381,171 B1 | 4/2002 | Inomata et al. | |
| 6,753,562 B1 * | 6/2004 | Hsu et al. | 257/295 |
| 6,949,778 B2 * | 9/2005 | Fumagalli et al. | 257/295 |
| 2001/0031547 A1 * | 10/2001 | Ohno et al. | 438/602 |
| 2004/0041217 A1 * | 3/2004 | Lee et al. | 257/414 |
| 2004/0178460 A1 * | 9/2004 | Lee et al. | 257/421 |

FOREIGN PATENT DOCUMENTS

| | | |
|---|---|---|
| JP | A 2001-93274 | 4/2001 |
| JP | A 2001-250998 | 9/2001 |
| JP | A 2004-111904 | 4/2004 |
| WO | WO 01/99137 A2 | 12/2001 |

OTHER PUBLICATIONS

Bland J A C et al: "Spin-polarized electron transport in ferromagnet/semiconductor hybrid structures (invited)" Journal of Applied Physics, American Institute of Physics. New York, US, vol. 89, No. 11, Jun. 1, 2001, pp. 6740-6744, XP012052326.

Xu Y B et al: "Ferromagnetic metal/semiconductor heterostructures for magneto-electronic devices" Sensors and Actuators A, Elsevier Sequoia S.A., Lausanne, CH, vol. 81, No. 1-3, Apr. 2000, pp. 258-262, XP004191301.

* cited by examiner

FIELD-EFFECT TRANSISTOR WITH SPIN-DEPENDENT TRANSMISSION CHARACTERISTICS AND NON-VOLATILE MEMORY USING THE SAME

FIELD OF THE INVENTION

The present invention relates to novel transistors, and more particularly, to a field-effect transistor with spin-dependent transmission characteristics and a non-volatile memory using the field-effect transistor.

BACKGROUND OF THE INVENTION

Today's highly advanced information society has dramatically developed, and particularly, "mobile communication devices" are being widely spread in the general public. The great demand for "mobile communication devices" is regarded as one of the essential elements in the future semiconductor industry. To satisfy the demand, however, it is necessary to achieve non-volatility of information, as well as high-speed performance, lower electric consumption, and large capacities that have conventionally be required in semiconductor integrated circuits. In response to such demands, attention has been drawn to a novel memory device in which the ferromagnetic storage technique that excels in non-volatile high-density recording combined with the semiconductor integration electronics. This device is called a magnetic random access memory (hereinafter referred to as "MRAM"), and a magnetic tunnel junction (hereinafter referred to as "MTJ") having a thin insulating tunnel barrier sandwiched between ferromagnetic electrodes is used as a memory device for the MRAM (disclosed in "Present and Future of Magnetic RAM Technology", K. Inomata, IEICE Trans. Electron. Vol. E84-C, pp. 740-746, 2001, for example).

In the MTJ, the tunneling resistance differs depending on the relative magnetization direction between the ferromagnetic electrodes. This is called a tunneling magneto-resistance (TMR) effect. Utilizing TMR, it is possible to electrically detect the magnetizing state of each ferromagnetic body. Accordingly, the information non-volatile storage technique using ferromagnetic bodies can be ideally incorporated into the semiconductor integration electronics by virtue of the MTJ.

In the following, an example of the conventional technique is described in conjunction with FIG. 10. As shown in FIG. 10, in a MRAM memory cell 100, a 1-bit memory cell is formed with a MTJ 101 and a metal-oxide-semiconductor field-effect transistor (hereinafter referred to as "MOSFET") 103. The MTJ 101 is a tunnel junction that is formed with a first ferromagnetic electrode 105, a second ferromagnetic electrode 107, and a tunnel barrier (an insulator) 108 formed with an insulator provided between the first and second ferromagnetic electrodes 105 and 107.

The source (S) of the MOSFET 103 is grounded (GND), and the drain (D) of the MOSFET 103 is connected to the ferromagnetic electrode 107 of the MTJ 101 with a plug PL or the like. The ferromagnetic electrode 105 of the MTJ 101 is connected to a bit line BL. A rewrite word line 111 is disposed to cross the bit line BL immediately above or below the MTJ 101, being electrically insulated from the MTJ 101 and the other lines by the insulating film 115. A read word line WL is connected to the gate electrode G of the MOSFET 103.

Since the magnetization direction can be maintained in a non-volatile manner in a ferromagnetic body, binary information can be stored in a non-volatile manner by adjusting the relative magnetization state between the ferromagnetic electrodes of the MTJ to parallel magnetization or antiparallel magnetization. In the MTJ, the tunneling resistance differs depending on the relative magnetization state between the two ferromagnetic electrodes, due to the TMR effect. Accordingly, the magnetization state in the MTJ can be electrically detected, using the tunneling resistance that depends on the magnetization state such as parallel magnetization and antiparallel magnetization.

To rewrite information, the retentivity of the ferromagnetic electrode 105 is made different from the retentivity of the ferromagnetic electrode 107 in the MTJ 101, or the magnetization of the ferromagnetic electrode with lower retentivity or an unfixed magnetization direction is inverted while the magnetization direction of the other ferromagnetic electrode is fixed. Hereinafter, the ferromagnetic electrode having the magnetization varied will be referred to as the "free layer", and the ferromagnetic electrode having the fixed magnetization will be referred to as the "pin layer". More specifically, currents are applied to the bit line BL and the rewrite word line 111 that cross each other on the selected cell, and the magnetization state of the MTJ 101 in the memory cell 100 selected by the compound magnetic field of the magnetic fields induced by the currents is changed to parallel magnetization or antiparallel magnetization. Here, the size of each current to be applied to each corresponding line is set so that the magnetization of each MTJ 101 of the unselected cells having the same bit line BL or the rewrite word line 111 as that of the selected cell is not inverted by the magnetic fields generated from only either the bit line BL or the rewrite word line 111. To read information, a voltage is applied to the read word lines WL connected to the selected cell so as to energize the MOSFET 103, and a read driving current is then applied to the MTJ 101 via the bit line BL. In the MTJ 101, the tunneling resistance differs depending on the magnetization state such as parallel magnetization or antiparallel magnetization, due to the TMR effect. Accordingly, the magnetization state can be checked by detecting a voltage drop (hereinafter referred to as "output voltage") caused by the read driving current in the MTJ 101 (see "Present and Future of Magnetic RAM Technology", K. Inomata, IEICE Trans. Electron. Vol. E84-C, pp. 740-746, 2001).

DISCLOSURE OF THE INVENTION

A MTJ has a binary resistance value that depends on whether the magnetization state between the ferromagnetic electrodes opposed to each other via a tunnel barrier is parallel magnetization or antiparallel magnetization. To accurately detect the binary information with a driving current, it is necessary to optimize the size of the output voltage through adjustment of the impedance (the junction resistance) of the MTJ.

To accurately read the contents of stored information, the ratio of output signals between the two magnetization states of parallel magnetization and antiparallel magnetization needs to be high. Therefore, it is necessary to maximize the rate of change in TMR between the case where the MTJ exhibits parallel magnetization and the case where the MTJ exhibits antiparallel magnetization. The MTR ratio depends on the spin polarization rate P of the ferromagnetic electrodes. To increase the TMR ratio, a ferromagnetic material with a high P value needs to be employed for the ferromagnetic electrodes.

The TMR ratio in a MTJ greatly depends on the bias voltage to be applied to the MTJ, and rapidly decreases according to the bias voltage. When a high driving current is applied to the MTJ to read information with high precision and at a high speed, the voltage drop becomes large in the MTJ, and the TMR ratio decreases accordingly. Therefore, bias resistance is required for the TMR ratio, so as to prevent the TMR ratio from decreasing even if a large voltage drop is caused in the MTJ.

A MRAM is suitable for high-density integration, having a simple structure. Also, a MRAM is desirable because each MTJ can be reduced to a nanoscale structure. When high integration of several gigabits or higher is to be realized, the channel length of the MOSFET is expected to be 0.1 μm or shorter. However, if minute MTJs are integrated in conformity with such minute transistors, the contacts and multilayer lines take up a large portion of the cell area, and high-density integration of both components becomes difficult. Therefore, there is a demand for memory cells with simpler structures.

The present invention provides a metal-insulator-semiconductor field-effect transistor (MISFET), using Schottky junctions for the source and the drain formed with a ferromagnetic material. The present invention also provides a large-capacity non-volatile memory device in which each 1-bit memory cell is formed with the transistor.

DESCRIPTION OF THE PREFERRED EMBODIMENTS

A metal-insulator-semiconductor field-effect transistor (hereinafter referred to as "MISFET") in accordance with the present invention stores information as the relative magnetization direction of a drain made of a ferromagnetic body with respect to a source made of a ferromagnetic body (hereinafter referred to as "ferromagnetic drain" and "ferromagnetic source"), and reads the stored information utilizing the transmission characteristics depending on the relative magnetization direction. With such a MISFET in accordance with the present invention, a single transistor can form a 1-bit non-volatile memory cell. Accordingly, a high-speed, high-capacity non-volatile memory can be produced.

First, a MISFET in accordance with a first embodiment of the present invention is described, with reference to the accompanying drawings.

Figure 1:
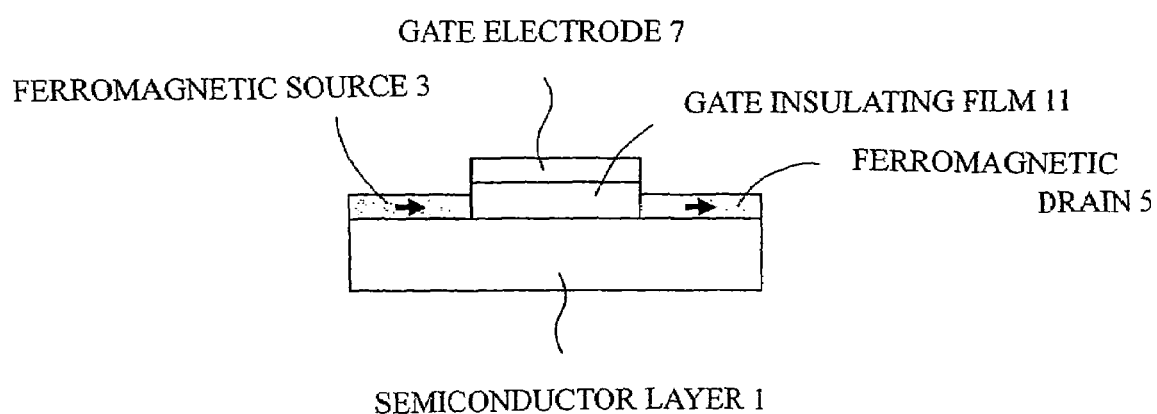
FIG. 1 is a cross-sectional view schematically illustrating the structure of a MISFET in accordance with a first embodiment of the present invention.

FIG. 1 is a cross-sectional view of the MISFET in accordance with the first embodiment of the present invention. As shown in FIG. 1, the MISFET of this embodiment includes a MIS structure that is the same as that of a general MISFET (a SiMOSFET, for example) that is formed with a gate electrode 7, a gate insulating film 11, and a non-magnetic semiconductor layer 1, and a source (a ferromagnetic source) 3 and a drain (a ferromagnetic drain) 5 that form a Schottky junction with the non-magnetic semiconductor film 1. The ferromagnetic source and the ferromagnetic drain may be made of: a ferromagnetic metal such as Fe, Ni, Co, Permalloy, CoFe alloy ($CO_{1-x}Fe_x$), and CoFeB alloy ($Co_{1-x-y}Fe_xB_y$); or a half metal such as Heusler alloy such as $CO_2MnSi$, zinc-blende CrAs, CrSb, and MnAs. Alternatively, the ferromagnetic source and the ferromagnetic drain may be formed with ferromagnetic semiconductors each having a ferromagnetic-metal band structure, or ferromagnetic semiconductors each having a half-metal band structure. The ferromagnetic source 3 and the ferromagnetic drain 5 are formed by epitaxially growing or depositing a ferromagnetic material on the non-magnetic semiconductor layer 1. Alternatively, the ferromagnetic source 3 and the ferromagnetic drain 5 may be formed by introducing magnetic atoms into the non-magnetic semiconductor layer 1 through thermal diffusion or ion implanting. The arrows shown on the ferromagnetic source and the ferromagnetic drain in FIG. 1 indicate the magnetization direction. The gate insulating film may be made of $SiO_2$, $Al_2O_3$, or $HfO_2$, which is a high dielectric constant material.

In the MISFET of this embodiment, a carrier of the same conduction type as the non-magnetic semiconductor layer (or a semiconductor substrate) 1 can be made a conduction carrier. Alternatively, a carrier of the opposite conduction type to the non-magnetic semiconductor layer 1 may be induced and used as a conduction carrier. Here, the former is referred to as an accumulation channel type, and the latter is referred to as an inversion channel type, for ease of explanation. In a case where an n-channel MISFET is formed, an n-type semiconductor is used for the accumulation channel type, while a p-type semiconductor is used for the inversion channel type. Likewise, in a case where a p-channel MISFET is formed, a p-type semiconductor is used for the accumulation channel type, while an n-type semiconductor is used for the inversion channel type. Hereinafter, an n-channel accumulation channel type will be referred to as an accumulation n-channel type, and an n-channel inversion channel type will be referred to as an inversion n-channel type. Likewise, a p-channel accumulation channel type will be referred to as an accumulation p-channel type, and a p-channel inversion channel type will be referred to as an inversion p-channel type.

Regardless of whether or not a channel actually exists, the semiconductor region immediately below the interface between the gate insulating film and the semiconductor is referred to as a channel region. In the following, the energy band structures of a transistor of the accumulation n-channel type and a transistor of the inversion n-channel type are described with respect to a case where a ferromagnetic metal is used for the ferromagnetic source and the ferromagnetic drain, and a case where a half metal is used for the ferromagnetic source and the ferromagnetic drain. Although not described in detail, a MISFET of the accumulation p-channel type and a MISFET of the inversion p-channel type can be formed in the same manner as described below. In accordance with the present invention, enhancement-type MISFETs and depression-type MISFETs can be formed. In the following, enhancement-type MISFETs will be described. Originally, the term "spin" is used as in "spin angular momentum". In the following description, however, electrons with up spins may be referred to simply as "up spins" in terms of carriers.

Figure 2A:
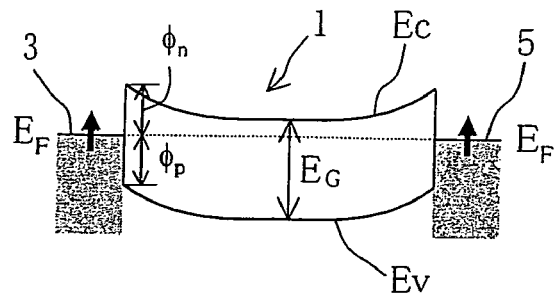
FIG. 2A shows the energy band structure of the ferromagnetic source, the semiconductor layer, and the ferromagnetic drain of a MISFET of the accumulation n-channel type that employs a ferromagnetic metal for the ferromagnetic source and the ferromagnetic drain in the structure of FIG. 1.
Figure 2B:
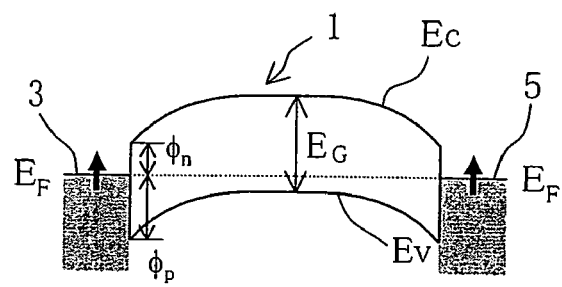
FIG. 2B shows the energy band structure of the ferromagnetic source, the semiconductor layer, and the ferromagnetic drain of a MISFET of the inversion n-channel type.
Figure 3A:
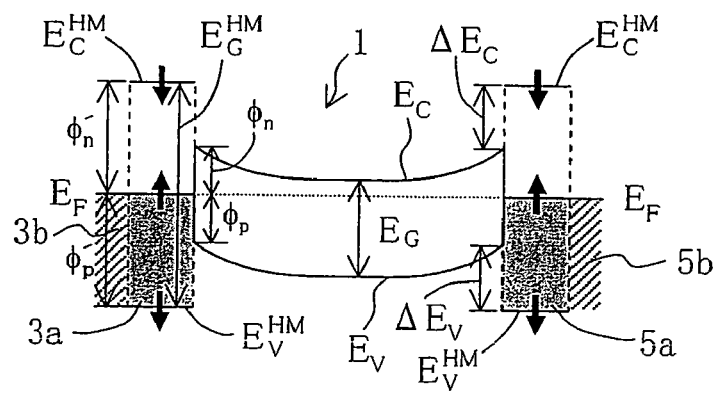
FIG. 3A shows the energy band structure of the ferromagnetic source, the semiconductor layer, and the ferromagnetic drain of a MISFET of the accumulation n-channel type that employs a half metal for the ferromagnetic source and the ferromagnetic drain in a structure in accordance with a second embodiment of the present invention.
Figure 3B:
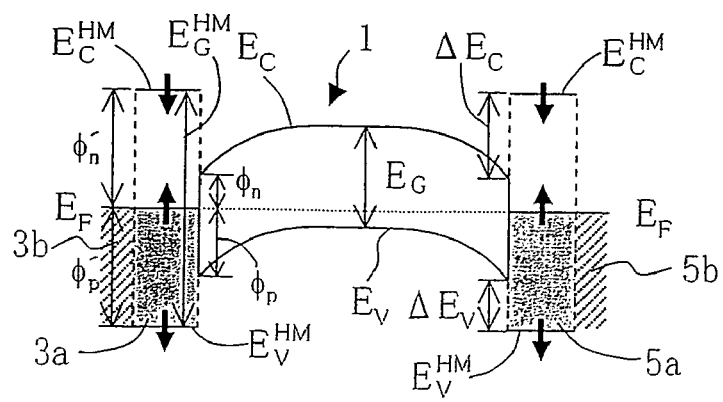
FIG. 3B shows the energy band structure of the ferromagnetic source, the semiconductor layer, and the ferromagnetic drain of a MISFET of the inversion n-channel type in the structure in accordance with the second embodiment.

FIGS. 2A and 2B show energy band structures in the case where a ferromagnetic metal is employed as the ferromagnetic body. FIGS. 3A and 3B show energy band structures in the case where a half metal is employed as the ferromagnetic body.

FIG. 2A shows the energy band structure in the vicinity of the channel region of a MISFET of the accumulation n-channel type in the case where a ferromagnetic metal is used for the ferromagnetic source and the ferromagnetic drain. The ferromagnetic source 3 and the ferromagnetic drain 5 are formed by Schottky junction the non-magnetic n-type semiconductor layer 1 to the ferromagnetic metal (3, 5). The solid lines on the ferromagnetic source 3 and the ferromagnetic drain 5, and the dotted line on the n-type semiconductor layer 1 in FIG. 2A indicate Fermi energy $E_F$. $E_G$ indicates the band gap of the semiconductor.

$E_C$ and $E_V$ indicate the bottom of the conduction band of the semiconductor layer 1 and the top of the valence band, respectively. In the drawings hereafter, $E_F$, $E_C$, $E_V$, and $E_G$ indicate the same as above. The height of the barrier of the Schottky junction between the ferromagnetic metal and the n-type semiconductor is denoted by $\phi_n$, which represents the energy difference between the Fermi energy $E_F$ and the energy $E_C$ at the bottom of the conduction band of the n-type semiconductor layer 1 on the junction interface. The arrows shown over the Fermi energy of the ferromagnetic source 3 and the ferromagnetic drain 5 indicate the direction of majority spins. An upward arrow indicates up spins, and a downward arrow indicates down spins. It should be noted that minority spins are not shown in the drawings. In the following cases where ferromagnetic metal is used, the direction of the majority spins is shown in the band structure.

FIG. 2B shows the energy band structure in the vicinity of the channel region of a MISFET of the inversion n-channel type in the case where a ferromagnetic metal is used for the ferromagnetic source and the ferromagnetic drain. The ferromagnetic source 3 and the ferromagnetic drain 5 made of the ferromagnetic metal and the p-type semiconductor layer 1 form a Schottky junction. The height of the barrier of the Schottky junction between the ferromagnetic metal and the p-type semiconductor is denoted by $\phi_p$, which represents the energy difference between the Fermi energy $E_F$ and the energy $E_V$ at the top of the valence band of the p-type semiconductor layer 1 on the junction interface. The energy difference between the Fermi energy $E_F$ and the energy $E_C$ at the bottom of the conduction band of the p-type semiconductor layer 1 on the junction interface is denoted by $\phi_n$.

Next, a MISFET in accordance with a second embodiment of the present invention is described, with reference to the accompanying drawings.

FIG. 3A illustrates a MISFET in accordance with this embodiment, and shows the energy band structure in the vicinity of the channel region of a MISFET of the accumulation n-channel type in the case where a half metal is used for the ferromagnetic source and the ferromagnetic drain. A half metal exhibits a metallic band structure (hereinafter referred to as the "metallic spin band") for one direction of spins, while exhibiting a semiconductor (or insulating) band structure (hereinafter referred to as the "semiconductor spin band") for the opposite spins. With a half metal, a half-occupied band for one spin is provided, and a fully-occupied band (a valence band) is separated for the other spin from an empty band (a conduction band) by a band gap. Accordingly, the Fermi energy $E_F$ crosses the metallic spin band of one spin, but crosses the band gap with respect to the other spin. The carrier conduction is realized only by the spin belonging to the metallic spin band.

In FIG. 3A, the solid line shown in the middle of each of a ferromagnetic source 3a and a ferromagnetic drain 5a indicates the Fermi energy $E_F$. Accordingly, $E_F$ also represents the Fermi surface of the metallic spin band. The solid lines $E_C^{HM}$ and $E_V^{HM}$ represent the bottom of the conduction band in the semiconductor spin band and the top of the valence band, respectively. The band gap of the semiconductor spin band of the half metal (3a, 5a) is denoted by $E_G^{HM}$. In the case where a MISFET of the accumulation n-channel type is formed with the half metal (3a, 5a), the metallic spin band of the half metal (3a, 5a) and the n-type semiconductor layer 1 need to form a Schottky junction with a barrier height $\phi_n$. With the junction, the bottom of the conduction band of the semiconductor spin band of the half metal (3a, 5a) exhibits higher energy than the bottom of the conduction band of the n-type semiconductor layer 1, and preferably forms an energy discontinuity $\Delta E_C$ at the interface.

An energy discontinuity $\Delta E_V$ represents the energy difference between the energy at the top of the valence band of the semiconductor spin band in the half metal (3a, 5a) and the energy at the top of the valence band of the n-type semiconductor layer 1 at the junction interface. In the following cases, the energy discontinuities at the junction interface between the semiconductor layer 1 and the conduction and valence bands in the semiconductor spin band are denoted by $\Delta E_C$ and $\Delta E_V$ in the case where a half metal is employed for the ferromagnetic source and the ferromagnetic drain.

In the drawing, the Fermi energy of non-magnetic contacts 3b and 5b joined to the ferromagnetic source 3a and the ferromagnetic drain 5a made of the half metal is also shown. Accordingly, in the case of employing a half metal, the ferromagnetic source 3 is formed with the ferromagnetic source 3a and the non-magnetic contact 3b. The same applies to the ferromagnetic drain. Hereinafter, if the ferromagnetic source 3 and the ferromagnetic drain 5 are described without specifying whether they are made of a ferromagnetic metal or a half metal, the ferromagnetic source 3 and the ferromagnetic drain 5 include the ferromagnetic source 3a and the ferromagnetic drain 5. The energy difference between the Fermi energy $E_F$ of the non-magnetic contacts 3b and 5b and the conduction band $E_C^{HM}$ in the semiconductor spin band is denoted by $\phi_n'$.

FIG. 3B shows the energy band structure in the vicinity of the channel region of a MISFET of the inversion n-channel type in the case where a half metal is used for the ferromagnetic source and the ferromagnetic drain.

The ferromagnetic source 3a and the ferromagnetic drain 5a need to be formed by Schottky junction the p-type semiconductor layer 1 to the metallic spin band of the half metal. The height of the Schottky junction barrier between the metallic spin band of the half metal (3a, 5a) and the p-type semiconductor layer 1 is denoted by $\phi_p$. The energy difference between the Fermi energy $E_F$ in the half metal (3a, 5a) and the energy $E_C$ at the bottom of the conduction band of the p-type semiconductor layer 1 at the junction interface is denoted by $\phi_n$. The bottom of the conduction band of the semiconductor spin band of the half metal (3a, 5a) exhibits higher energy than the bottom of the conduction band of the p-type semiconductor layer 1, and preferably forms an energy discontinuity $\Delta E_C$ at the interface.

The difference between the Fermi energy and the energy $E_C^{HM}$ at the bottom of the conduction band of the semiconductor spin band in the half metal (3a, 5a) is denoted by $\phi_n'$. The difference between the Fermi energy and the energy $E_V^{HM}$ at the top of the valence band of the semiconductor spin band in the half metal (3a, 5a) is denoted by $\phi_p'$.

In the following, the principles of the operation of each MISFET in accordance with this embodiment are described, with reference to the accompanying drawings. In each MISFET in accordance with this embodiment, the ferromagnetic source functions as a spin injector that inject spins to the channel, while the ferromagnetic drain functions as a spin analyzer that detects, as en electric signal, the orientation of the spins of conduction carriers injected to the channel. In each MISFET in accordance with this embodiment, it is possible to employ either a ferromagnetic metal or a half metal for the ferromagnetic source and the ferromagnetic drain, as described above. Further, it is possible to use a ferromagnetic metal for one of the ferromagnetic source and the ferromagnetic drain, and a half metal for the other one of the ferromagnetic source and the ferromagnetic drain.

Hereinafter, the situation in which the relative magnetization direction of the ferromagnetic drain is the same as that of the ferromagnetic source will be referred to as "parallel magnetization", and the situation in which the relative magnetization direction of the ferromagnetic drain is opposite to that of the ferromagnetic source will be referred to as "antiparallel magnetization". The channel length of each MISFET is sufficiently shorter than the spin relaxation length, and the Rashba effect due to a gate voltage should be ignored.

Figure 4A:
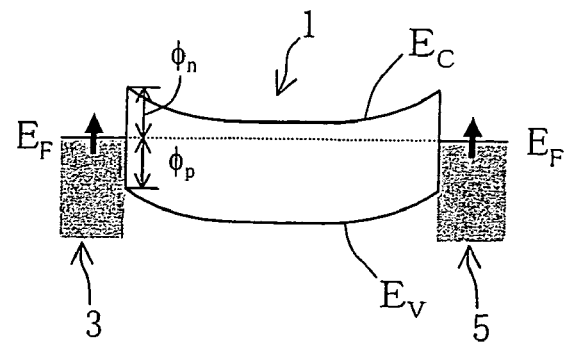
FIG. 4A illustrates the principles of the operation of a MISFET having the energy band structure shown in FIG. 2A, and shows the energy band structure in a case of parallel magnetization.

Referring now to FIGS. 4A through 4D, the principles of the operation of a MISFET of the accumulation n-channel type using a ferromagnetic metal for the ferromagnetic source and the ferromagnetic drain are described. FIG. 4A shows an energy band structure in the parallel state, and corresponds to FIG. 2A.

Figure 4B:
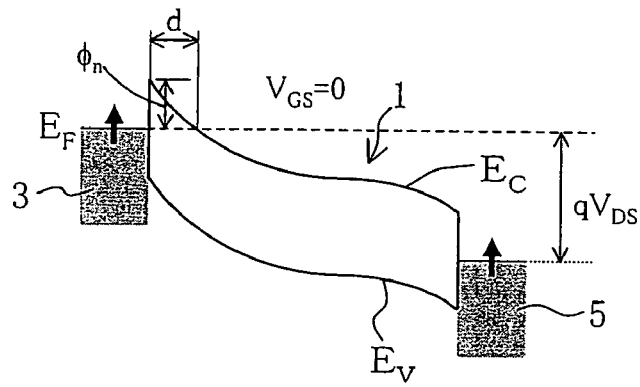
FIG. 4B shows the energy band structure that is obtained when a bias $V_{DS}$ is applied in the case where the ferromagnetic source and the ferromagnetic drain exhibit parallel magnetization.

In the parallel state shown in FIG. 4A, a bias $V_{GS}$ (=0) is applied between the ferromagnetic source 3 and the gate electrode 7, and a bias $V_{DS}$ is applied between the ferromagnetic source 3 and the ferromagnetic drain 5. The bias $V_{DS}$ is then divided between the Schottky junction of the ferromagnetic source 3 and the Schottky junction of the ferromagnetic drain 5, and accordingly, the potential shown in FIG. 4B is obtained. The Schottky junction of the ferromagnetic drain 5 is forward-biased, and the height of the Schottky barrier on the drain side, seen from the bottom of the conduction band of the center portion of the channel, decreases (or disappears). On the other hand, the Schottky junction of the ferromagnetic source 3 is reverse-biased, and the height of the Schottky barrier on the source side, seen from the bottom of the conduction band of the center portion of the channel, increases.

Here, the bias $V_{DS}$ is applied in such a manner that the Fermi energy $E_F$ crosses the band edge of the Schottky barrier on the source side, but the bias $V_{DS}$ is of such a size as to hardly cause a current through a tunneling effect. Accordingly, the distance d between the Schottky junction interface on the source side and the crossing point of the Fermi energy of the ferromagnetic source 3 and the band edge of the Schottky barrier is adequately thick so that a carrier tunneling effect is not caused in the channel from the ferromagnetic source 3. Since the Schottky junction on the source side is reverse-biased, a current almost equivalent to a reverse saturation current of the Schottky junction due to the carriers thermally beyond the barrier with a height $\phi_n$ is generated from the ferromagnetic source 3. However, the current can be sufficiently restricted and made smaller by properly adjusting the height $\phi_n$. Accordingly, the MISFET is put into a shut-off state, when the bias $V_{GS}$ is 0.

Figure 4C:
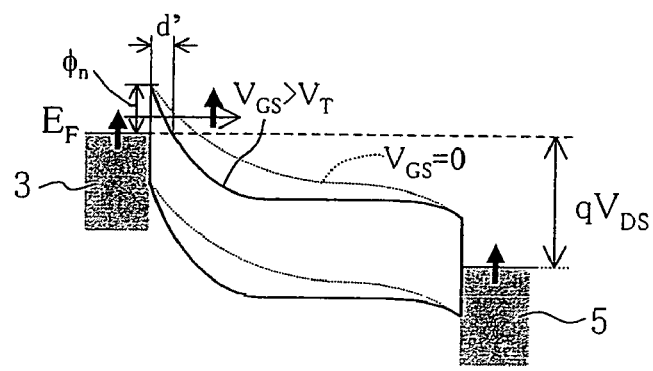
FIG. 4C shows the energy band structure that is obtained when a bias $V_{GS}$ is further applied in the situation shown in FIG. 4B.

Next, the bias $V_{GS}$ (>0) is applied to the gate electrode 7. The electric field in the vicinity of the Schottky barrier on the source side is intensified by the line of electric force directed from the gate electrode 7 to the ferromagnetic source 3. The width of the Schottky barrier decreases as shown in FIG. 4C (indicated by d'). Accordingly, the conduction electrons of the ferromagnetic source 3 pass through the potential barrier by virtue of a tunneling effect, and are injected to the channel region immediately below the gate insulating film 11. At this point, majority spins and minority spins are injected from the ferromagnetic source 3. Since the carrier density of the majority spins is higher than that of the minority spins, the injected electrons are spin-polarized. The spin polarization rate of the injected electrons depends on the spin polarization rate in the vicinity of the Fermi energy. As the spin polarization rate in the vicinity of the Fermi energy becomes higher, the spin polarization rate of the injected electrons becomes higher.

Hereinafter, electrons that are spin-polarized will be referred to as spin-polarized electrons. The majority spins and the minority spins of spin-polarized electrons are in parallel with the majority spins and the minority spins of the ferromagnetic source 3. The spin-polarized electrons injected to the channel are transported to the Schottky barrier interface of the ferromagnetic drain 5 by virtue of the bias $V_{DS}$, while being attracted toward the interface between the gate insulating film and the semiconductor by virtue of the bias $V_{GS}$. In the case where the ferromagnetic source 3 and the ferromagnetic drain 5 exhibit a parallel magnetization configuration, the majority spins and the minority spins of spin-polarized electrons are in parallel with the majority spins and the minority spins of the ferromagnetic drain 5. Accordingly, the spin-polarized electrons injected to the ferromagnetic drain 5 pass through the ferromagnetic drain 5, and become a current flowing into the ferromagnetic drain (hereinafter, the current will be referred to as "drain current"), without adverse influence of spin-dependent diffusion. Particularly, in the case where the ferromagnetic source 3 and the ferromagnetic drain 5 are in a parallel magnetization configuration, the bias $V_{GS}$ of a predetermined drain current is set as a threshold voltage $V_T$.

Figure 4D:
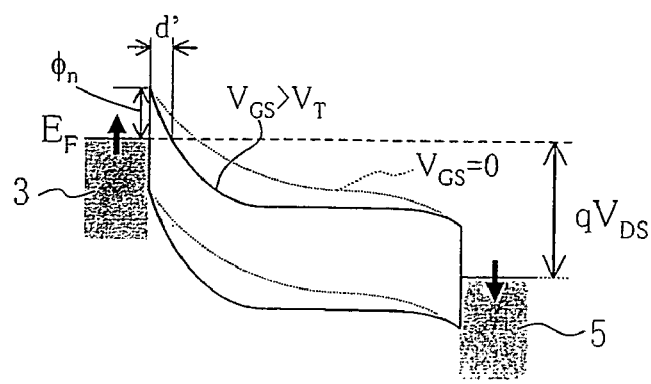
FIG. 4D shows the energy band structure that is obtained in a case where the ferromagnetic source and the ferromagnetic drain exhibit antiparallel magnetization with the same bias as that of FIG. 4C.

On the other hand, in a case where the ferromagnetic source 3 and the ferromagnetic drain 5 are in an antiparallel magnetization configuration, the majority spins among spin-polarized electrons injected to the channel are in antiparallel with the majority spins of the ferromagnetic drain 5 (see FIG. 4D). Accordingly, the spin-polarized electrons of the channel cause electric resistance due to spin-dependent scattering in the ferromagnetic drain 5. Therefore, even if the MISFET has a uniform bias, the drain current becomes smaller due to the spin-dependent scattering in the antiparallel magnetization configuration, compared with the case of parallel magnetization. In short, the transmission (mutual) conductance in the case where the relative magnetization between the ferromagnetic source 3 and the ferromagnetic drain 5 is in an antiparallel state is smaller than that in the case where the relative magnetization is in a parallel state. If the channel length is equal to or shorter than the mean free path with respect to the carrier energy relaxation, the carriers in the channel are conducted in a ballistic manner. Therefore, a magnetoresistive effect that is similar to a tunneling magnetoresistive effect can be expected. In such a case, the variation in tarns-conductance becomes even wider between the parallel magnetization and the antiparallel magnetization.

Figure 5A:
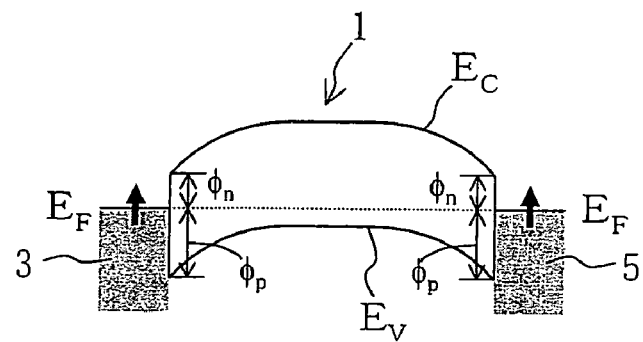
FIG. 5A illustrates the principles of the operation of a MISFET having the energy band structure shown in FIG. 2B, and shows the energy band structure in a case of parallel magnetization.
Figure 5B:
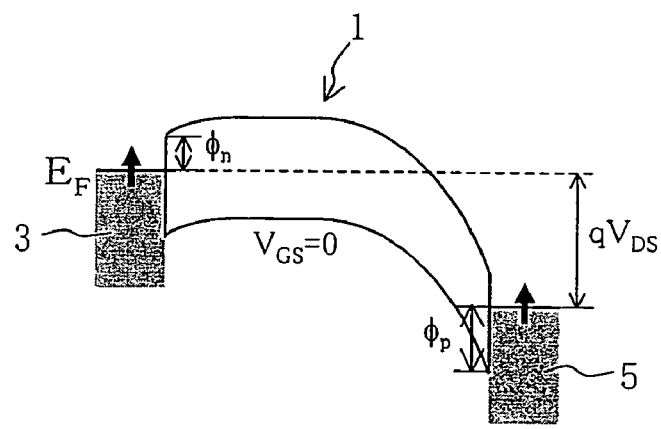
FIG. 5B shows the energy band structure that is obtained when a bias $V_{DS}$ is applied in the case where the ferromagnetic source and the ferromagnetic drain exhibit parallel magnetization.

FIGS. 5A through 5D illustrate the principles of the operation of an inversion n-channel MISFET having the ferromagnetic source 3 and the ferromagnetic drain 5. When the bias $V_{DS}$ (>0) is applied in a parallel magnetization configuration (see FIG. 5A), with the bias $V_{GS}$ being 0, the ferromagnetic source 3 is forward-biased as shown in FIG. 5B, and the ferromagnetic drain 5 is reverse-biased. Since the channel region is of p type, a current is generated when holes are injected from the ferromagnetic drain 5. However, few holes are injected due to the reverse-biased Schottky junction of the ferromagnetic drain 5. Although a low current of a size almost equal to the reverse saturation current of the Schottky junction formed by the holes thermally beyond $\phi_p$ is generated, this current can be sufficiently reduced by properly adjusting $\phi_p$. Accordingly, the MISFET is put into a shut-off state, with the bias $V_{GS}$ being 0.

Figure 5C:
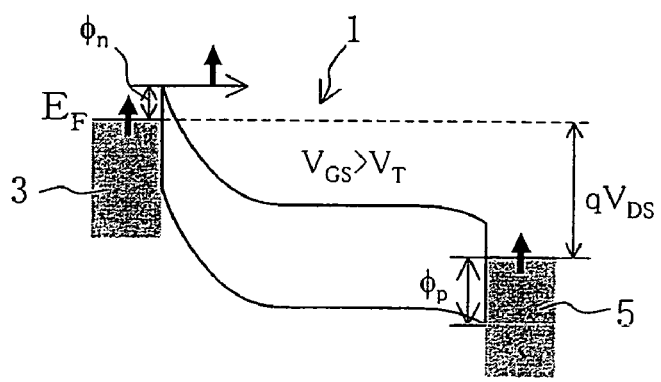
FIG. 5C shows the energy band structure that is obtained when a bias $V_{GS}$ is further applied in the situation shown in FIG. 5B.

When a bias $V_{GS}$ (>$V_T$) greater than a certain threshold voltage $V_T$ determined from the device structure is applied to the gate electrode 7 (shown in FIG. 1), electrons are induced at the interface between the gate insulating film and the semiconductor, thereby forming an inversion layer (although the threshold voltage $V_T$ differs between the inversion channel type and the accumulation channel type, the threshold voltage is denoted by $V_T$ in either case, for ease of explanation). At this point, a barrier with a height $\phi_p$ against the electrons in the inversion layer is formed at each junction interface with the ferromagnetic source 3 and the ferromagnetic drain 5 in the channel region. However, the junction of the ferromagnetic drain 5 and the junction of the ferromagnetic source 3 are biased with the bias $V_{DS}$, as shown in FIG. 5C.

As described above, by selecting a sufficiently large height $\phi_p$, the height $\phi_n$ (=$E_G$-$\phi_p$) is made small, and spin-polarized electrons are injected to the channel due to heat radiation from the ferromagnetic source 3. Also, even if the height $\phi_n$ is not so small as to thermally discharge the carriers from the ferromagnetic source 3, the Schottky barrier on the side of the ferromagnetic source 3 is tunneled to inject spin-polarized electrons from the ferromagnetic source 3 to the channel, as in the case of the accumulation channel type.

The spin-polarized electrons injected to the channel are transported to the Schottky barrier interface on the side of the ferromagnetic drain 5 by the bias $V_{DS}$. In the case where the ferromagnetic source 3 and the ferromagnetic drain 5 are in the parallel magnetization configuration, the majority spins and the minority spins of the spin-polarized electrons are in parallel with the majority spins and the minority spins of the ferromagnetic drain 5. Accordingly, in the case of parallel magnetization, the spin-polarized electrons injected to the ferromagnetic drain 5 pass through the ferromagnetic drain 5 and become a drain current, without adverse influence of spin-dependent scattering, as in the case of the accumulation channel type.

Figure 5D:
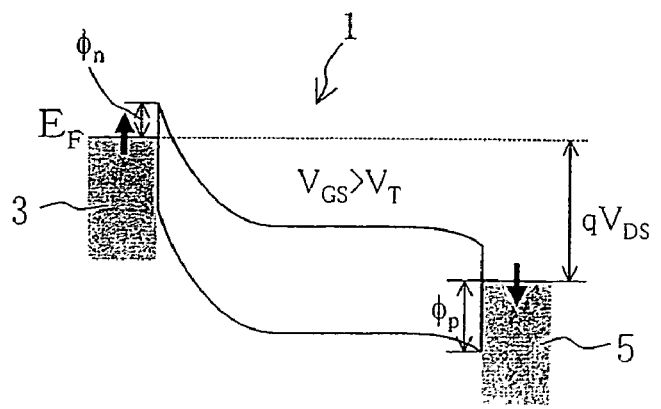
FIG. 5D shows the energy band structure that is obtained in a case where the ferromagnetic source and the ferromagnetic drain exhibit antiparallel magnetization with the same bias as that of FIG. 5C.

Meanwhile, in the case where the ferromagnetic source 3 and the ferromagnetic drain 5 are in the antiparallel magnetization configuration as shown in FIG. 5D, the majority spins of the spin-polarized electrons injected to the channel are in antiparallel with the majority spins of the ferromagnetic drain 5. Accordingly, the spin-polarized electrons cause electric resistance due to spin-dependent scattering in the ferromagnetic drain 5. In this manner, the tarns-conductance of a MISFET of the inversion channel type also varies depending on the relative magnetization between the ferromagnetic source 3 and the ferromagnetic drain 5. Even with the same bias, the drain current in the case where the ferromagnetic source 3 and the ferromagnetic drain 5 are in an antiparallel magnetization configuration becomes lower than that in the case of parallel magnetization. Also, if the channel length is equal to or shorter than the mean free path with respect to the carrier energy relaxation, a magnetoresistive effect that is similar to a tunneling magnetoresistive effect can be expected. In such a case, the variation in tarns-conductance becomes even wider between the parallel magnetization and the antiparallel magnetization.

Figure 6A:
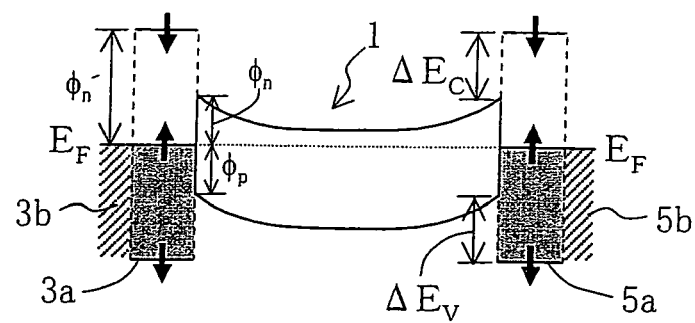
FIG. 6A illustrates the principles of the operation of a MISFET having the energy band structure shown in FIG. 3A, and shows the energy band structure in a case of parallel magnetization.

Next, a case where a half metal is used as a ferromagnetic body is described. Referring to FIGS. 6A through 6D, the principles of the operation of a MISFET of the accumulation n-channel type in the case where a half metal is used for the ferromagnetic source and the ferromagnetic drain are described. FIG. 6A shows the energy band structure in a parallel magnetization configuration, and corresponds to FIG. 3A.

Figure 6B:
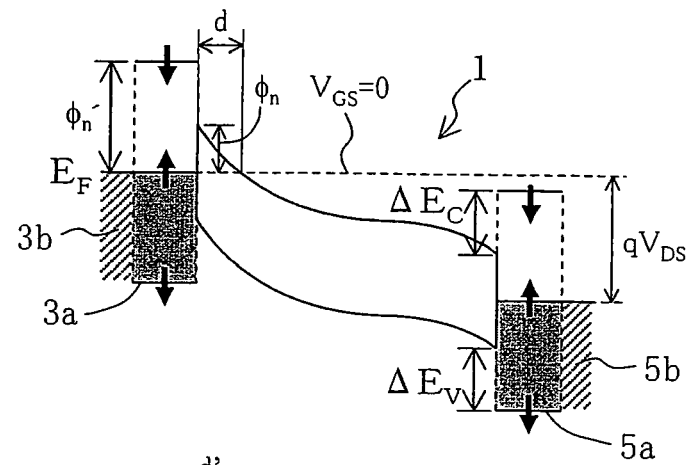
FIG. 6B shows the energy band structure that is obtained when a bias $V_{DS}$ is applied in the case where the ferromagnetic source and the ferromagnetic drain exhibit parallel magnetization.

FIG. 6B shows the potential shape in a case where a bias $V_{DS}$ (>0) is applied, with a bias $V_{GS}$ being 0. Hereinafter, the spins belonging to the metallic spins band of the ferromagnetic source $3a$ will be referred to as "up spins", while the spins belonging to the semiconductor spins band will be referred to as "down spins". For the up spins belonging to the metallic spin band, a Schottky junction with a height of $\phi_n$ is formed at the junction interface with the semiconductor layer 1, and the bias $V_{DS}$ is divided between the source-side Schottky junction and the drain-side Schottky junction. Accordingly, the Schottky junction of the ferromagnetic drain $5a$ is forward-biased, while the Schottky junction of the ferromagnetic source $3a$ is reverse-biased. At this point, the bias $V_{DS}$ is applied in such a manner that the Fermi energy $E_F$ of the ferromagnetic source $3a$ crosses the band edge of the source-side Schottky barrier, but the barrier width d of the Schottky junction is made so thick that the up spins are not tunneled from the metallic spin band of the ferromagnetic source $3a$. With the $V_{GS}$ being 0, tunnel injection of the up spins in the metallic spin band of the ferromagnetic source $3a$ is restricted in the channel region. Also, the up spins can be injected as a reverse saturation current of the Schottky junction caused by holes thermally beyond the barrier height $\phi_n$ of the Schottky junction. However, the current can be made sufficiently lower by properly adjusting the value of $\phi_n$.

Meanwhile, the band gap of the semiconductor spin band of the ferromagnetic source $3a$ having down spins forms an energy barrier with a height $\phi_n'$ between the semiconductor spins band of the ferromagnetic source $3a$ and the non-magnetic contact $3b$. Since no conduction carriers exist in the semiconductor spin band of the ferromagnetic source $3a$, the down spins tunnels the semiconductor spin band of the ferromagnetic source $3a$ from the non-magnetic contact $3b$, or thermally go beyond the barrier, so as to inject the down spins to the semiconductor layer 1. The ferromagnetic source $3a$ is made sufficiently thick, and the height $\phi_n'$ of the energy barrier, seen from the non-magnetic metal electrode $3b$, is made sufficiently large, so that the probability of the down spins being injected to the channel region can be made very low, and carriers are not injected. Accordingly, with the bias $V_{GS}$ being 0, a current due to up spins and down spins is hardly generated, and the MISFET is put into a shut-off state.

Figure 6C:
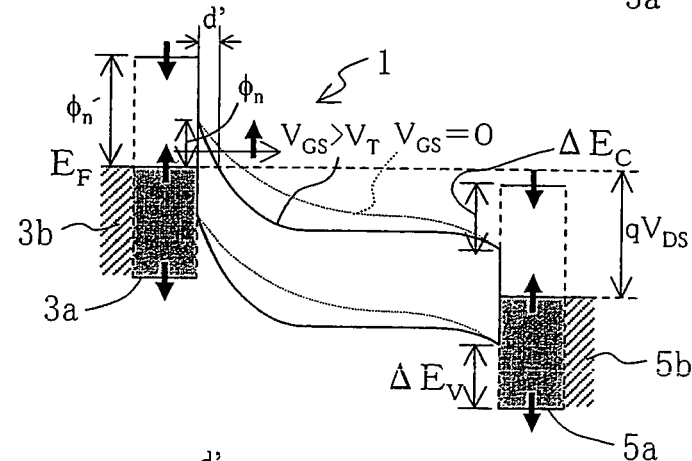
FIG. 6C shows the energy band structure that is obtained when a bias $V_{GS}$ is further applied in the situation shown in FIG. 6B.

When a bias $V_{GS}$ (>0) is applied to the gate electrode 7 (shown in FIG. 1), the electric field in the vicinity of the Schottky barrier on the source side is intensified by the electric flux line directed from the gate electrode 7 to the ferromagnetic source $3a$, as shown in FIG. 6C. The width of the Schottky barrier then decreases as shown in FIG. 6C (indicated by d'). Accordingly, the up spins from the metallic spin band of the ferromagnetic source $3a$ tunnel the Schottky barrier, and are injected to the channel region in the semiconductor layer 1 immediately below the gate insulating film. Here, the down spins from the non-magnetic contact $3b$ are hardly injected due to the energy barrier with a height $\phi_n'$ of the semiconductor spin band of the ferromagnetic source $3a$. Therefore, the ferromagnetic source $3a$ made of a half metal selectively injects up spins.

The up spins injected to the channel are transported to the Schottky barrier interface of the ferromagnetic drain $5a$ by virtue of the bias $V_{DS}$. In the case where the ferromagnetic source $3a$ and the ferromagnetic drain $5a$ exhibit parallel magnetization, the injected up spins are in parallel with the spins in the metallic spins band of the ferromagnetic drain $5a$. Accordingly, the up spins injected to the ferromagnetic drain $5a$ pass through the ferromagnetic drain $5a$, and become a drain current, without adverse influence of spin-dependent diffusion. Particularly, in the case where the ferromagnetic source $3a$ and the ferromagnetic drain $5a$ exhibit parallel magnetization, the bias $V_{GS}$ that generates a predetermined drain current is set as a threshold voltage $V_T$.

Figure 6D:
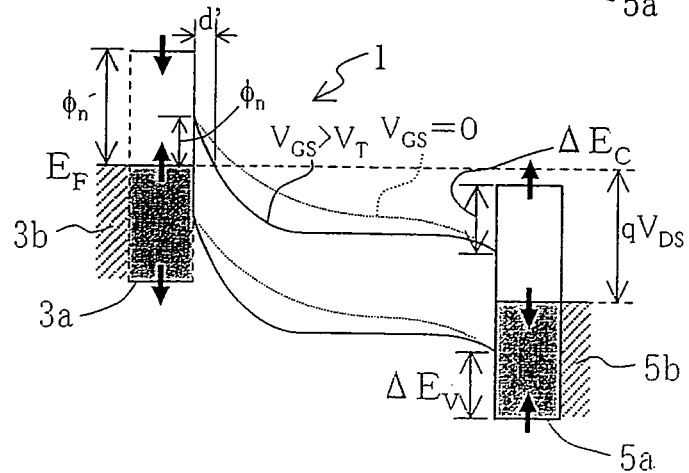
FIG. 6D shows the energy band structure that is obtained in a case where the ferromagnetic source and the ferromagnetic drain exhibit antiparallel magnetization with the same bias as that of FIG. 6C.

On the other hand, in a case where the ferromagnetic source $3a$ and the ferromagnetic drain $5a$ exhibit antiparallel magnetization, the up spins injected to the channel are in antiparallel with the spins in the metallic spin band of the ferromagnetic drain $5a$, but are in parallel with the spins in the semiconductor spin band, as shown in FIG. 6D. Accordingly, the up spins injected to the channel sense the ferromagnetic drain $5a$ as the energy barrier with a height of $\Delta E_C$. The film thickness of the ferromagnetic drain $5a$ and the height $\Delta E_C$ are adjusted so that the up spins in the channel cannot tunnel the barrier or cannot thermally go beyond the barrier. In this manner, the up spins injected from the non-magnetic source electrode $3b$ can hardly pass through the ferromagnetic drain $5a$, and a drain current is hardly generated. Thus, the half metal of the ferromagnetic drain $5a$ transmits only the spins in parallel with the spins in the metallic spin band, but does not transmit the spins in antiparallel with the spins in the metallic spins band.

From the ferromagnetic source $3a$ made of a half metal, spin-polarized electrons with a very high spin polarization rate can be injected to the channel. Also, since the spin selection rate of the ferromagnetic drain $5a$ made of a half metal is very high, the drain current in the case where the ferromagnetic source $3a$ and the ferromagnetic drain 5 are in an antiparallel magnetization configuration is much lower than the drain current in the case of parallel magnetization. Accordingly, using a half metal, the difference can be made very large between the drain current in the case where the relative magnetization state of the ferromagnetic source $3a$ and the ferromagnetic drain $5a$ exhibits parallel magnetization, and the drain current in the case of antiparallel magnetization, compared with a case of using a regular ferromagnetic metal.

Next, Referring to FIGS. 7A through 7D, the principles of the operation of a MISFET of the inversion n-channel type in the case where a half metal is used for the ferromagnetic source and the ferromagnetic drain are described. In the following, the spins belonging to the metallic spin band of the ferromagnetic source 3a made of a half metal will be referred to "up spins", while the spins belonging to the semiconductor spin band will be referred to "down spins".

Figure 7A:
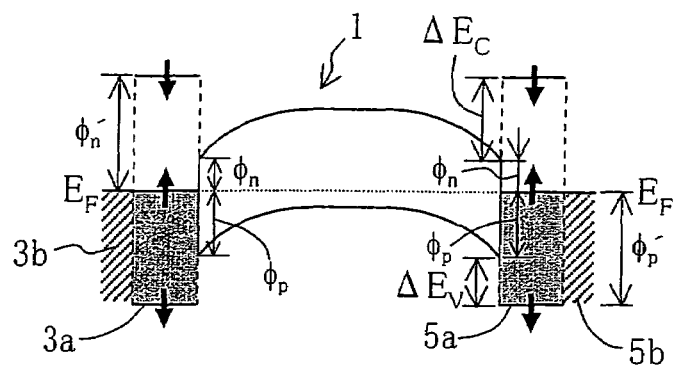
FIG. 7A illustrates the principles of the operation of a MISFET having the energy band structure shown in FIG. 3B, and shows the energy band structure in a case of parallel magnetization.
Figure 7B:
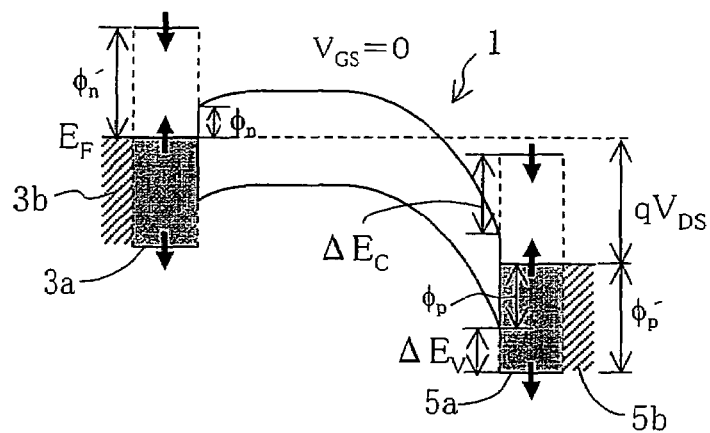
FIG. 7B shows the energy band structure that is obtained when a bias $V_{DS}$ is applied in the case where the ferromagnetic source and the ferromagnetic drain exhibit parallel magnetization.

FIG. 7A shows the energy band structure in a parallel magnetization configuration, and corresponds to FIG. 3B. In a case where a bias $V_{DS}$ is applied, with a bias $V_{GS}$ being 0, a current is generated in the MISFET when holes are injected from the drain side, as the semiconductor layer 1 is a p-type semiconductor. However, the Schottky junction by the metal spin band of the half metal of the ferromagnetic drain 5a is reverse-biased, and hole injection is restricted. Although a current almost the same size as the reverse saturation current of the Schottky junction is generated, it can be made sufficiently lower by properly adjusting $\phi_p$.

Also, hole injection from the drain-side non-magnetic contact 5b is also restricted by the energy barrier $\phi_p'$ of the semiconductor spin band of the ferromagnetic drain 5a. Thus, the MISFET is put into a shut-off state in the case shown in FIG. 7B.

When a bias $V_{GS}$ greater than the threshold voltage $V_T$ is applied to the gate electrode 7, electrons are induced at the interface between the gate insulating film and the semiconductor, thereby forming an inversion layer (the threshold voltage $V_T$ differs between the inversion channel type and the accumulation channel type). At this point, a barrier with a height $\phi_n$ is formed with the metallic spin band made of a half metal at each junction interface between the inversion layer and the ferromagnetic source 3a and the ferromagnetic drain 5a, as shown in FIG. 7C.

Figure 7C:
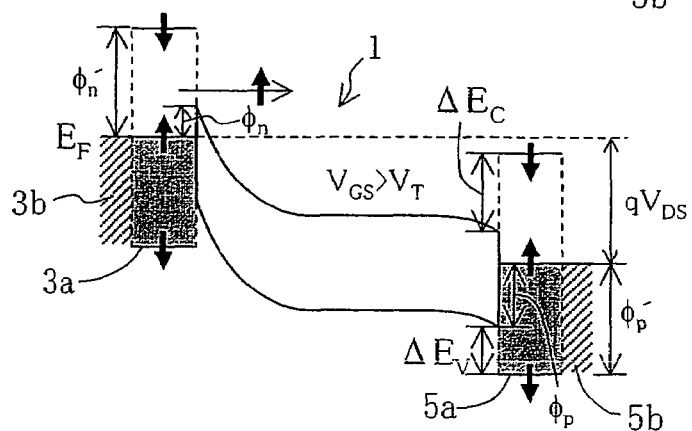
FIG. 7C shows the energy band structure that is obtained when a bias $V_{GS}$ is further applied in the situation shown in FIG. 7B.

By applying the bias $V_{DS}$, the junctions of the ferromagnetic drain 5a and the ferromagnetic source 3a are biased as shown in FIG. 7C. By selecting a sufficiently large height $\phi_p$, the height $\phi_n$ ($=E_G-\phi_p$) is made small, and up spins are injected to the channel due to thermal emission from the metallic spin band of the ferromagnetic source 3a. Also, even if the height $\phi_n$ is not so small as to thermally inject up spins from the ferromagnetic source 3a, the up spins can be tunnel-injected from the metallic spin band of the ferromagnetic source 3a to the channel as in the case of the accumulation channel type. On the other hand, the down spins in the semiconductor spin band of the ferromagnetic source 3a are hardly injected.

The up spins injected to the channel are transported to the junction interface on the drain side by the bias $V_{DS}$. In the case where the ferromagnetic source 3a and the ferromagnetic drain 5a exhibit parallel magnetization, the up spins injected to the channel are in parallel with the spins in the metallic spin band of the ferromagnetic drain 5a. Accordingly, in the case of parallel magnetization, the up spins pass through the metallic spin band of the ferromagnetic drain 5 and become a drain current.

Figure 7D:
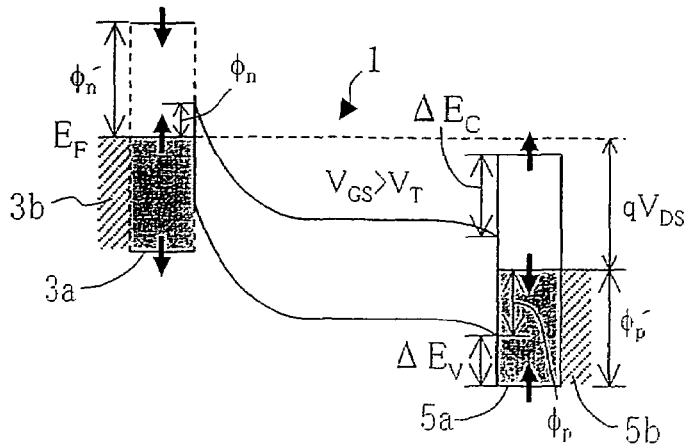
FIG. 7D shows the energy band structure that is obtained in a case where the ferromagnetic source and the ferromagnetic drain exhibit antiparallel magnetization with the same bias as that of FIG. 7C.

On the other hand, in a case where the ferromagnetic source 3a and the ferromagnetic drain 5a exhibit antiparallel magnetization, the up spins injected to the channel are in antiparallel with the spins in the metallic spin band of the ferromagnetic drain 5a, but are in parallel with the spins in the semiconductor spin band of the ferromagnetic drain 5a, as shown in FIG. 7D. Accordingly, the up spins injected to the channel sense the ferromagnetic drain 5a as the energy barrier with a height of $\Delta E_C$. The film thickness of the ferromagnetic drain 5a and the height $\Delta E_C$ are adjusted so that the up spins in the channel cannot tunnel the barrier or cannot thermally go beyond the energy barrier with a height of $\Delta E_C$. In this manner, drain current components are hardly generated.

As described above, the half metal of the ferromagnetic drain 5a transmits only the spins that are in parallel with the spins in the metallic spin band. Accordingly, the tarns-conductance can be controlled depending on the relative magnetization state between the ferromagnetic source 3a and the ferromagnetic drain 5a. Thus, the drain current in the case where the ferromagnetic source 3a and the ferromagnetic drain 5a exhibit antiparallel magnetization is lower than that in the case of parallel magnetization.

In the above described MISFET that has a ferromagnetic source (3 or 3a) and a ferromagnetic drain 5 (5 or 5a) made of a ferromagnetic metal or a half metal, the semiconductor layer 1 may be replaced with an undoped semiconductor or an intrinsic semiconductor. In such a case, the barrier structure formed with the junctions caused between the ferromagnetic metal and the semiconductor differs from a Schottky barrier, but the same MISFET operation can be expected with this barrier structure. In this MISFET, the channel region is formed with an intrinsic semiconductor. Accordingly, adverse influence of impurity scattering is not seen in the channel region, and higher mobility of conduction carriers can be expected. Particularly, in a MISFET with a nanoscale short channel, ballistic conduction of carriers that are effective for high-speed operations can be expected. Also in this MISFET, a variation in threshold voltage is not basically caused, even in a case where scale-downed MISFETs with small threshold voltages are highly integrated. Furthermore, a channel formed with an intrinsic semiconductor is suitable for a SOI structure. Accordingly, with an intrinsic semiconductor used for a channel region, the performance of the MISFET of the present invention and the performance of a non-volatile memory (described later) in which the MISFET is employed can be further increased.

Figure 12:
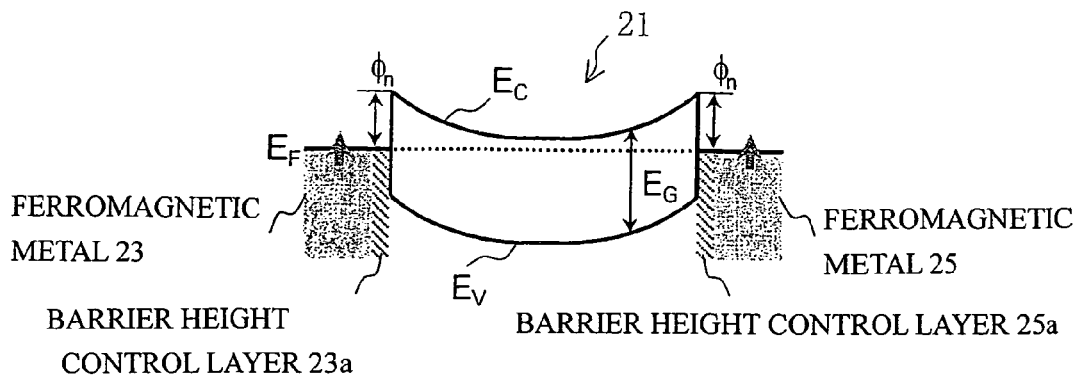
FIG. 12 shows the energy band structure of a MISFET in accordance with a third embodiment of the present invention.

Next, a MISFET in accordance with a third embodiment of the present invention is described in conjunction with the accompanying drawings. In a MISFET in accordance with this embodiment, the ferromagnetic source and the ferromagnetic drain form Schottky junctions with a semiconductor layer and a thin metal layer with a height desired for a barrier. A ferromagnetic metal or a half metal is formed on the metal layer. FIG. 12 shows an energy band structure of a MISFET in accordance with this embodiment. As shown in FIG. 12, the MISFET in accordance with this embodiment has ferromagnetic metal members 23 and 25 as a source and a drain, and thin metal layers 23a and 25a introduced at the interfaces between a semiconductor layer and the ferromagnetic metal members 23a and 25a. The thin metal layers 23a and 25a are used to control the barrier height. Schottky junctions of the metal layers 23a and 25a and the semiconductor layer 21 with which a desired barrier height $\phi_n$ can be obtained are first formed, and the ferromagnetic metal layers 23 and 25 are formed on the metal layer 23a and 25a, respectively. The specific example of the materials for the metal layers 23a and 25a include silicides such as $ErSi_x$ or $PtSi_x$, with the Si being the semiconductor layer 21.

As in the structure shown in FIG. 12, the Schottky barrier height can also be controlled with a structure in which the ferromagnetic metal layers 23 and 25 are replaced with the half metal employed in the second embodiment, or a MISFET having a half-metal ferromagnetic source and a half-metal ferromagnetic drain. Such a structure can also be provided in accordance with the present invention. Alternatively, another semiconductor with which a desired Schottky barrier height at the interface with the ferromagnetic metal or the half metal may be inserted at the interface between the semiconductor layer and the ferromagnetic metal or the half metal. To control the Schottky barrier height, a metal/semiconductor heterostructure may also be inserted at the interface between the semiconductor layer and the ferromagnetic metal or the half metal.

By the above described technique, the material for the ferromagnetic source and the ferromagnetic drain can be arbitrarily selected, regardless of the Schottky height between the semiconductor layer and the ferromagnetic metal or the half metal.

Next, a MISFET in accordance with a fourth embodiment of the present invention is described in conjunction with the accompanying drawings. In the first through third embodiments, the ferromagnetic source and the ferromagnetic drain are formed with Schottky junctions of a ferromagnetic metal or a half metal. The MISFET in accordance with this embodiment, on the other hand, has a ferromagnetic source and a ferromagnetic drain made of ferromagnetic semiconductors. With this structure, the same effects as those of the MISFETs of the first through third embodiments can be expected, without Schottky junctions.

Figure 13A:
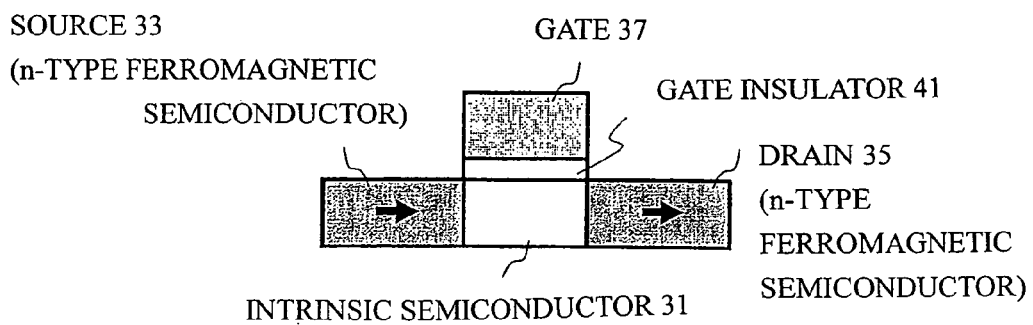
FIG. 13A shows the energy band structure of a MISFET in which an n-type ferromagnetic semiconductor is used for the source and the drain, and an intrinsic semiconductor is interposed between the source and the drain, in accordance with a fourth embodiment of the present invention.

As shown in FIG. 13A, for example, the MISFET has an intrinsic semiconductor 31 used as a channel region, and also has a gate insulator 41 and a gate (electrode) 37 stacked on the intrinsic semiconductor 31. In this MISFET, n-type ferromagnetic semiconductors are used for a ferromagnetic source 33 and a ferromagnetic drain 35, so as to form an n-channel MISFET that can exhibit the same characteristics as those of any of the MISFETs (the MISFET shown in FIG. 2A, for example). To produce a p-channel MISFET, p-channel ferromagnetic semiconductors should be used for the ferromagnetic source and the ferromagnetic drain.

Figure 13B:
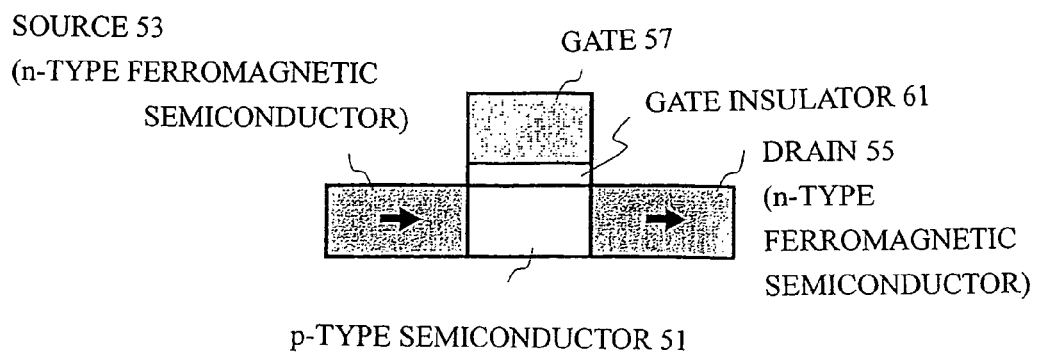
FIG. 13B shows the energy band structure of a MISFET in which an n-type ferromagnetic semiconductor is used for the source and the drain, and a p-type semiconductor is interposed between the source and the drain, in accordance with a fifth embodiment of the present invention.

Next, a MISFET in accordance with a fifth embodiment of the present invention is described in conjunction with the accompanying drawings. The MISFET in accordance with this embodiment has a ferromagnetic source and a ferromagnetic drain formed with pn junctions between a semiconductor and ferromagnetic semiconductors (in this case, the MISFET operates as an inversion channel type). As shown in FIG. 13B, for example, n-type ferromagnetic semiconductors are used for a source 53 and a drain 55, and a p-type semiconductor is used for a semiconductor layer 51 that includes the channel region. In this structure, a gate insulating film 61 and a gate (electrode) 57 are also stacked on the p-type semiconductor layer 51. Likewise, p-type ferromagnetic semiconductors may be used for the source and the drain, while an n-type semiconductor is used for the channel region.

As described in the fourth and fifth embodiments of the present invention, even in a where the ferromagnetic source and the ferromagnetic drain are formed with ferromagnetic semiconductors, the drain current differs between parallel magnetization and antiparallel magnetization, due to the spin-dependent scattering at the drain. Also, if the channel length is shorter than the mean free path with respect to the carrier energy relaxation, spin-dependent conduction that is similar to a tunneling magnetoresistive effect can be obtained from the ballistic conduction of the carriers. In such a case, the variation in tarns-conductance between parallel magnetization and antiparallel magnetization can be made wider.

Examples of the ferromagnetic semiconductors used for the MISFETs in accordance with the fourth and fifth embodiments include those with transition metal elements or rare-metal elements such as Mn and Cr incorporated into semiconductors of Si, Ge, $Si_xFe_{1-x}$, or SiC.

Figure 8:
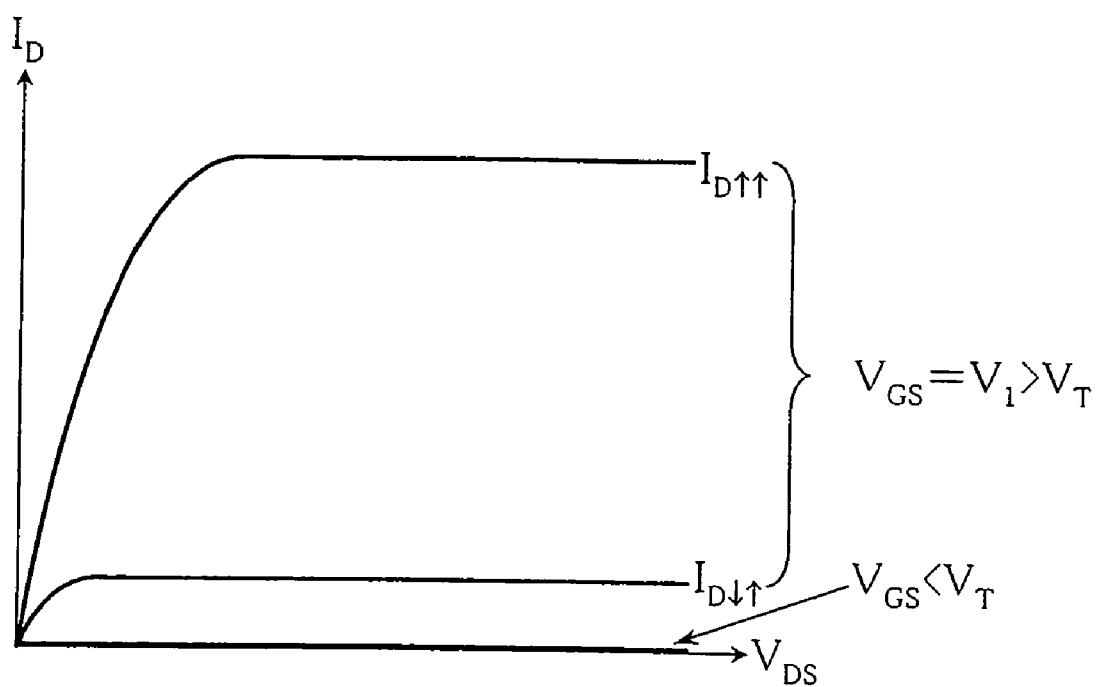
FIG. 8 schematically shows the drain current-voltage characteristics of the source ground of a MISFET in accordance with this embodiment.

Next, examples of output characteristics of the MISFETs in accordance with the above described embodiments are described. FIG. 8 shows the $V_{DS}$ dependence of a drain current ID, with $V_{GS}$ being a parameter. Whether a ferromagnetic metal or a half metal is used for the ferromagnetic source 3 and the ferromagnetic drain 5 in the MISFET in accordance with this embodiment, and whether the MISFET is of the inversion channel type or the accumulation channel type, the MISFET is put into a shutoff state when a voltage equal to or lower than a predetermined threshold voltage $V_T$ determined from the device structure is applied to the gate electrode 7. The state of the MISFET does not depend on the relative magnetization state between the ferromagnetic source 3 and the ferromagnetic drain 5.

A voltage $V_1$ ($>V_T$) equal to or higher than the threshold voltage is applied to the gate electrode 7, so that the transistor can be put into a conductive state. Here, the drain current $I_D$ generated between the ferromagnetic source 3 and the ferromagnetic drain 5 varies depending on the relative magnetization state of the ferromagnetic drain 5 with respect to the ferromagnetic source 3. With the same bias being applied, the drain current $I_D$ is higher ($I_{D\uparrow\uparrow}$ in FIG. 8) in the case of parallel magnetization, and the drain current $I_D$ is lower ($I_{D\uparrow\downarrow}$ in FIG. 8) in the case of antiparallel magnetization. In other words, the transmission (mutual) conductance of the MISFET is controlled by adjusting the magnetization state between the ferromagnetic source 3 and the ferromagnetic drain 5. Accordingly, in the MISFET of this embodiment, the drain current $I_D$ can be controlled by adjusting the voltage to be applied to the gate electrode 7, and the tarns-conductance depends on the relative magnetization state of the ferromagnetic drain 5 with respect to the ferromagnetic source 3.

A ferromagnetic body can maintain a magnetization direction unless a magnetic field greater than its coercive force is applied from the outside. Accordingly, in the MISFET in accordance with this embodiment, binary information can be stored in accordance with the relative magnetization state between the ferromagnetic source and the ferromagnetic drain to parallel magnetization or antiparallel magnetization.

In the above described MISFET, the relative magnetization state between the ferromagnetic source and the ferromagnetic drain can be electrically sensed based on the size of the drain current or the tarns-conductance. Accordingly, the above described MISFET alone can form a 1-bit non-volatile memory cell.

Figure 9A:
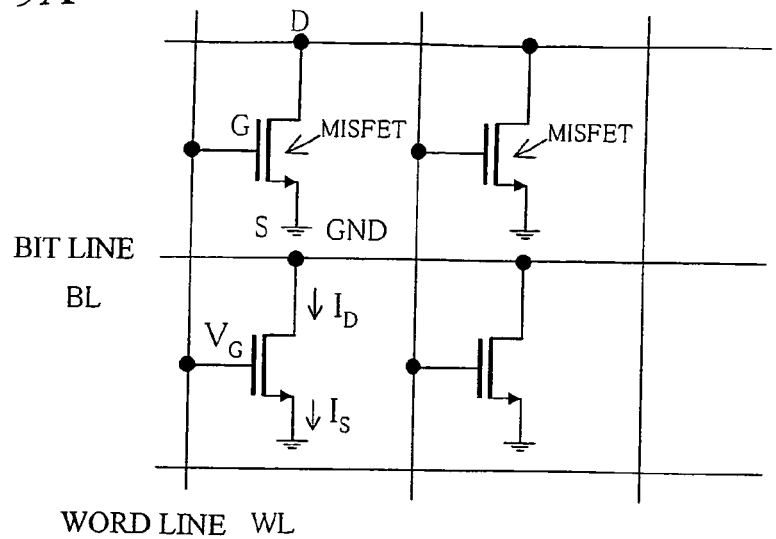
FIG. 9A illustrates an example structure of a memory circuit that employs MISFETs in accordance with this embodiment.

FIG. 9A illustrates an example structure of a memory circuit that employs MISFETs in accordance with this embodiment. In the memory circuit shown in FIG. 9A, MISFETs are arranged in a matrix fashion. In each MISFET, a source terminal S is grounded while a drain terminal D and a gate terminal G are respectively connected to a read bit line BL and a read word line WL. Also, a rewrite word line and a rewrite bit line are arranged to cross each other, while being electrically insulated from the other lines in the MISFET. The read bit line BL and the read word line WL may also serve as the rewrite bit line and the rewrite word line. FIG. 9A shows the cell structure in the case where the read bit line BL and the read word line WL also serve as the rewrite bit line and the rewrite word line. In the example shown in FIG. 9A, each MISFET alone can form a memory cell, and a very simple line arrangement can be employed.

Figure 10:
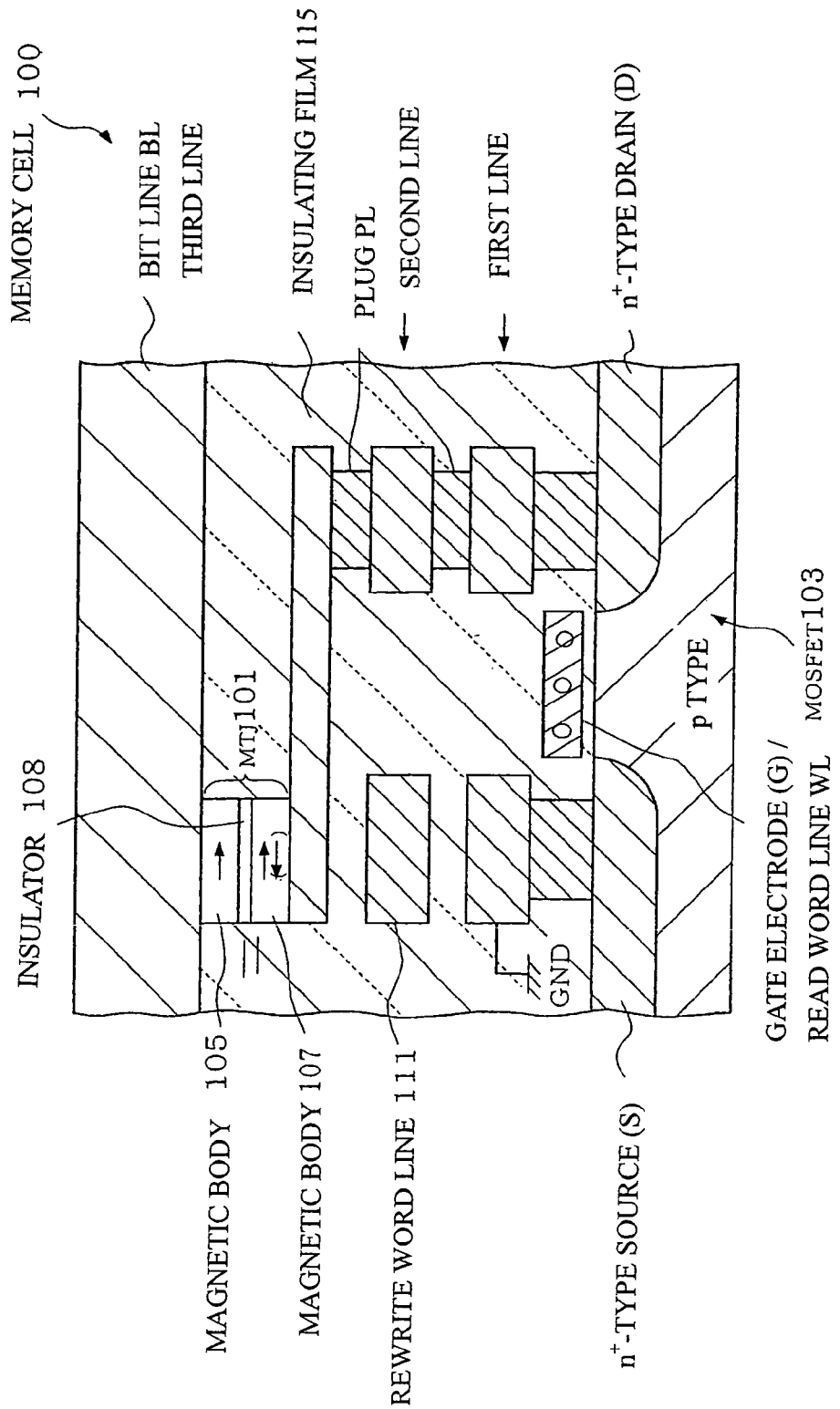
FIG. 10 is a cross-sectional view of a memory cell that is used in a conventional MRAM.

A conventional MRAM memory cell includes one MTJ, one MISFET, and four lines (see FIG. 10). In this structure, it is difficult to reduce the cell area by sharing a source between adjacent cells, due to the existence of the MTJ and a rewrite word line. On the other hand, a memory cell in accordance with this embodiment has a simplest structure that is formed with one MISFET and three lines, as shown in FIG. 9A. With such memory cells, a layout suitable for a small-sized memory can be readily employed.

Figure 11:
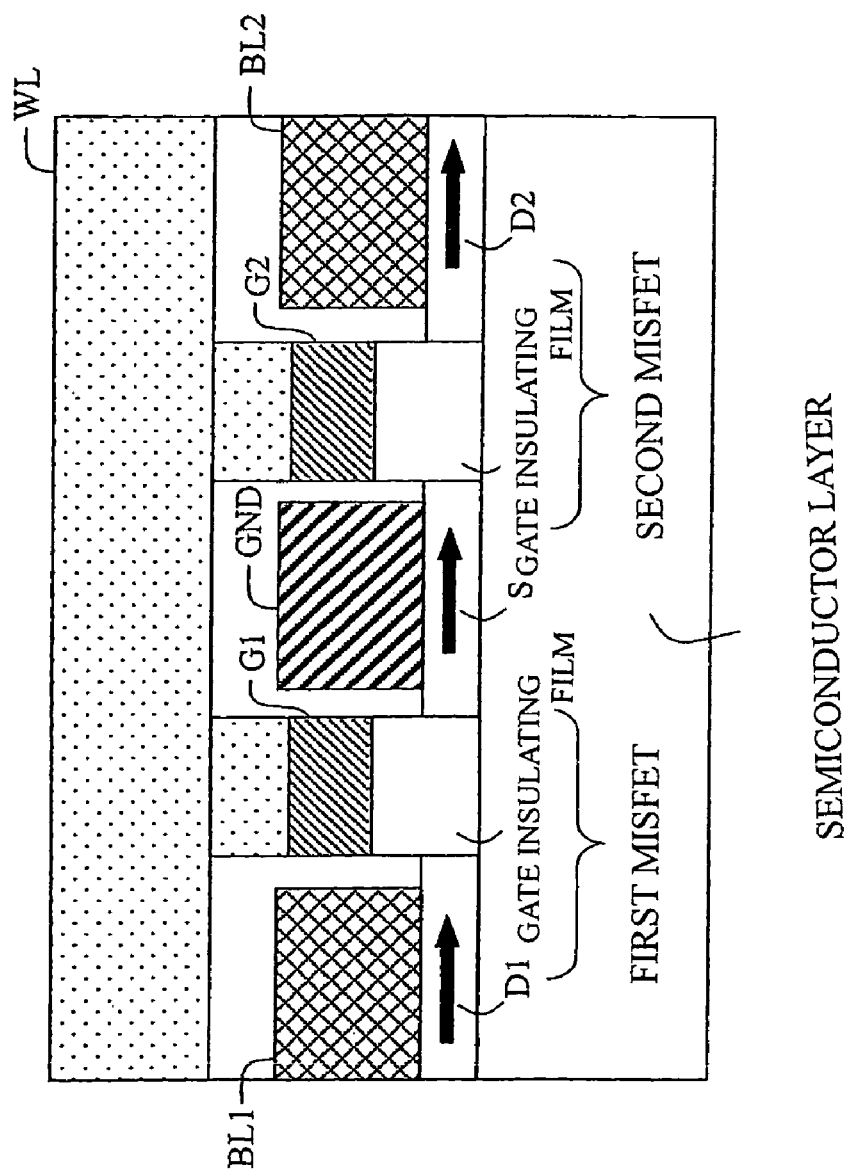
FIG. 11 illustrates an example structure of a memory cell in accordance with any of the embodiments of the present invention, in which a ferromagnetic source is shared.

For example, it is possible to form a structure in which one ferromagnetic source is shared between two MISFETs of this embodiment. FIG. 11 is a cross-sectional view of a memory cell with the shared source structure. The memory cell shown in FIG. 11 includes a first MISFET and a second MISFET that are adjacent to each other, a word line WL that connects the gate electrode G1 of the first MISFET and the gate electrode G2 of the second MISFET, a first bit line BL1 that is connected to the first ferromagnetic drain D1 of the first MISFET, a second bit line BL2 that is connected to the second ferromagnetic drain D2 of the second MISFET, a ferromagnetic source S that is shared between the first and second MISFETs, and a line for grounding the ferromagnetic source S. Since the source is shared in this structure, a cell structure that is more suitable for a high-density memory can be formed.

In the following, the operation of a memory cell is described in conjunction with FIG. 9A. The above described rewrite/read bit line and the rewrite/read word line that are shared are referred to simply as the bit line BL and the word line WL. To rewrite information, the coercive force of the ferromagnetic source 3 or the ferromagnetic drain 5 is changed, of the relative magnetization direction of the ferromagnetic drain 5 with respect to the ferromagnetic source 3 is adjusted to either parallel magnetization or antiparallel magnetization in the MISFET in accordance with this embodiment. For example, parallel magnetization and antiparallel magnetization are represented by the binary information of "0" and "1", respectively. More specifically, a current is applied to the bit line BL and the word line WL that crosses each other on the selected memory cell, and information is stored by inverting the magnetization of the ferromagnetic body with smaller coercive force or the ferromagnetic body without a fixed magnetization direction of the memory cell selected by a compound magnetic field induced by the current flowing through the respective lines. Here, the value of the current to be applied to the respective lines should be determined so as not to cause magnetization inversion with a magnetic field induced only from one of the lines. Thus, the unselected cells connected to the bit line BL or the word line WL to which the selected cell is also connected can be protected from magnetization inversion.

To read information, a voltage is applied to the word line WL connected to the selected cell, so as to energize the MISFET of this embodiment. A drain voltage is then applied to the bit line BL, so as to detect the size of the drain current $I_D$. In the MISFET in accordance with this embodiment, in the case where the relative magnetization state of the ferromagnetic drain with respect to the ferromagnetic source exhibits parallel magnetization, the tarns-conductance is great, and a high drain current $I_D$ is generated. In the case of antiparallel magnetization, on the other hand, the tarns-conductance is small, and the drain current $I_D$ is low. Based on the size of the drain current $I_D$, the relative magnetization between the ferromagnetic source and the ferromagnetic drain can be detected. Alternatively, the detection may be carried out by applying a necessary bias through precharging.

In a regular MTJ, the current in the case of parallel magnetization is generated by the tunneling between the state densities of the majority spins in the two ferromagnetic electrodes, and the tunneling between the state densities of the minority spins in the two ferromagnetic electrodes. In the case of antiparallel magnetization, the current is generated by the tunneling from the state density of the minority spins to the state density of the majority spins, and the tunneling from the state density of the majority spins to the state density of the minority spins. Accordingly, the currents flowing in the case of parallel magnetization and antiparallel magnetization contains current components generated from minority spins. Therefore, it is not easy to increase the ratio of the current in the case of parallel magnetization to the current in the case of antiparallel magnetization.

In the MISFET having the ferromagnetic source and the ferromagnetic drain made of a half metal in accordance with this embodiment, on the other hand, only the spins belonging to the metallic spin band in the ferromagnetic source can be injected to the channel, due to the junction between the half metal and the semiconductor layer. Further, only the spins in parallel with the spins belonging to the metallic spin band in the ferromagnetic drain can be extracted and used as a drain current (hereinafter, this effect of a half metal will be referred to as the "spin filter effect").

In the MISFET having the ferromagnetic source and the ferromagnetic drain made of a half metal in accordance with this embodiment, the current ratio (the drain current ratio) between parallel magnetization and antiparallel magnetization can be made higher than the current ratio that is obtained in a MTJ. Accordingly, with the MISFET in accordance with this embodiment, a magnetization state can be readily detected in the above described memory circuit.

Also, in the case where the ferromagnetic source and the ferromagnetic drain are made of a ferromagnetic metal, the spin polarization rate (the spin injection rate) of the carriers injected from the ferromagnetic source can be made higher than the spin polarization rate of the ferromagnetic metal by virtue of a strong field effect that is generated at the source-side Schottky barrier due to the gate bias. With such a strong field effect, the drain current ratio between parallel magnetization and antiparallel magnetization can be made higher than the current ratio in a MTJ.

With a conventional MTJ, there also has been the problem that the TMR ratio greatly decreases with a bias necessary in the circuit, as the TMR ratio rapidly drops with a decrease in bias voltage. In the MISFET in accordance with this embodiment, on the other hand, the spin-dependent scattering due to the ferromagnetic metal, or the spin filter effect due to the half metal is utilized. Therefore, the bias dependence that is seen in a conventional MTJ is not observed. Accordingly, a high drain current ratio can be achieved with a bias necessary for the circuit.

Figure 9B:
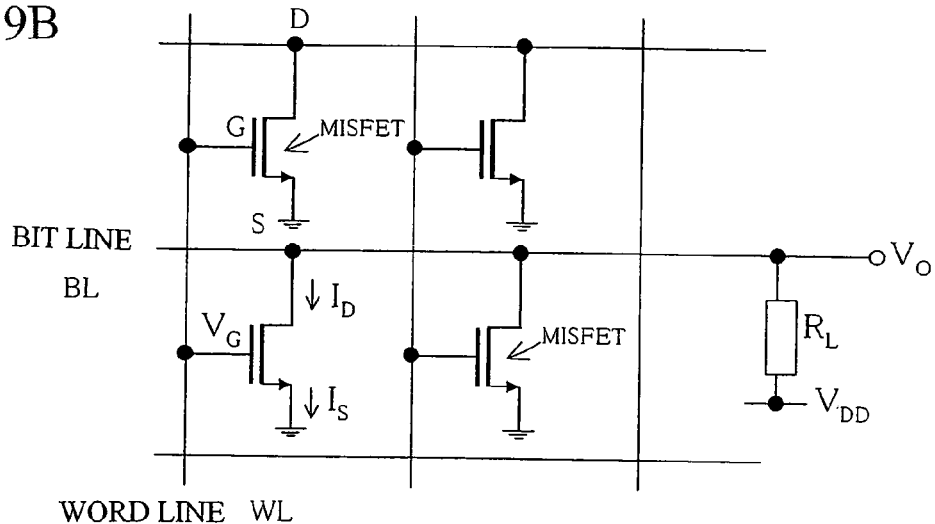
FIG. 9B illustrates a memory circuit that has an output terminal $V_o$ connected to the bit line end of the memory circuit of FIG. 9A, and is connected to a supply voltage $V_{DD}$ via a load $R_L$ branching from the output terminal $V_o$.
Figure 9C:
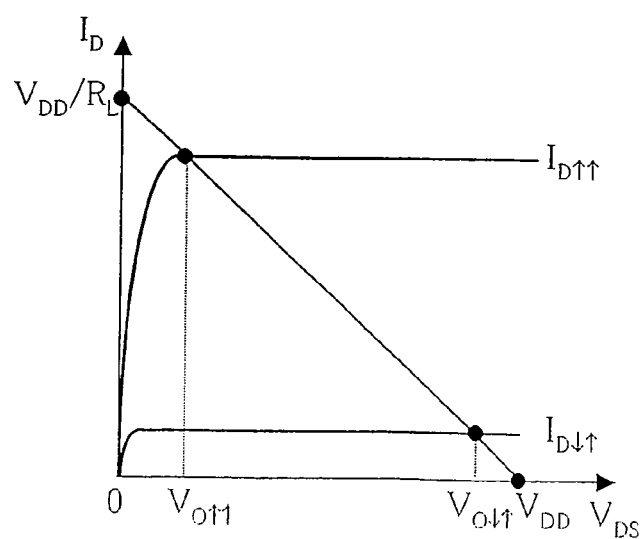
FIG. 9C shows the static characteristics and operating points of the memory cell of FIG. 9B.

FIG. 9B shows a memory circuit that has an output terminal $V_o$ connected to the bit line end of the memory circuit of FIG. 9A, and is connected to a supply voltage $V_{DD}$ via a load $R_L$ branching from the output terminal $V_o$. FIG. 9C shows the static characteristics and operating points of the memory cell of FIG. 9B. Here, a net resistance is used as a load, but it is also possible to use an active load formed with a transistor. As shown in FIG. 9C, the gate voltage $V_{GS}$ is applied to the gate electrode of the MISFET at the time of reading information, and the supply voltage $V_{DD}$ is applied to the bit line BL via the load resistance $R_L$. The operating point determined by the load resistance $R_L$ moves on the load line shown in FIG. 9C, in accordance with the magnetization state between the ferromagnetic source and the ferromagnetic drain. The output signals $V_o$ in the cases of parallel magnetization and antiparallel magnetization can be represented by $V_{o\uparrow\uparrow}$ and $V_{o\uparrow\downarrow}$ shown in FIG. 9C. The absolute values and the ratio ($V_{o\uparrow\uparrow}/V_{o\uparrow\downarrow}$) of the output signals can be optimized with the external circuit parameters such as $R_L$ and $V_{DD}$. For example, in a case where the drain current ratio $I_{D\uparrow\uparrow}/I_{D\uparrow\downarrow}$ is small, a large output signal ratio can be obtained by adjusting (reducing, in this case) the inclination of the load line. Thus, the memory circuit of this embodiment is advantageous in that output signals of desired size can be obtained.

As described so far, a MISFET having a ferromagnetic source and a ferromagnetic drain in accordance with any of the embodiments of the present invention functions as a transistor that can control the drain current by adjusting the gate voltage, and characteristically controls the transmission (mutual) conductance by adjusting the relative magnetization direction of the ferromagnetic drain with respect to the ferromagnetic source. The relative magnetization between the ferromagnetic source and the ferromagnetic drain can be maintained as it is, without energy supply. This feature is referred to as the non-volatile characteristics. Accordingly, binary information can be stored in a non-volatile manner in accordance with the relative magnetization direction between the ferromagnetic source and the ferromagnetic drain. Furthermore, with the above described transmission characteristics, the relative magnetization direction can be electrically detected. With the MISFET, one transistor alone can form a 1-bit non-volatile memory cell. Accordingly, with a MISFET of the present invention, a non-volatile memory cell can be readily formed. Thus, a more highly-integrated non-volatile memory circuit that can operate at a higher speed can be obtained.

Although the preferred embodiments of the present invention have been described, the present invention is not limited to those specific examples. It should be obvious to those skilled in the art that various changes and modifications can be made to the above described embodiments. For instance, any MISFET described in this specification can of course be applied to any memory device or memory circuit described in this specification.

INDUSTRIAL APPLICABILITY

In a MISFET of the present invention that has a ferromagnetic source and a ferromagnetic drain formed with Schottky junctions made of a ferromagnetic metal or a half metal, binary information can be stored in accordance with the relative magnetization direction of the ferromagnetic drain with respect to the ferromagnetic source, and the relative magnetization direction can be electrically detected. Accordingly, with such a MISFET, a single transistor alone can form a non-volatile memory cell. Thus, a high-speed, highly integrated non-volatile memory circuit can be realized.

The invention claimed is:

1. A transistor comprising:
a ferromagnetic source that is formed with a ferromagnetic body from which spin-polarized conduction carriers are injected;
a ferromagnetic drain that is formed with a ferromagnetic body that receives the spin-polarized conduction carriers injected from the ferromagnetic source;
a semiconductor layer that is provided between the ferromagnetic source and the ferromagnetic drain, and forms a Schottky junction having a Schottky barrier at each junction interface with the ferromagnetic source and the ferromagnetic drain; and
a gate electrode that is formed associated with the semiconductor layer,
wherein the Schottky barrier appears on the conduction band side when the spin-polarized conduction carriers are electrons, and the Schottky barrier appears on the valence band side when the spin-polarized conduction carriers are holes, with the spin-polarized conduction carriers being of the same conduction type as that of the semiconductor layer (an accumulation channel type).

2. The transistor as claimed in claim 1, wherein the magnetization direction of the ferromagnetic source or the ferromagnetic drain is inverted, so that the relative magnetization direction of the ferromagnetic drain is made equal ("parallel magnetization") to or opposite ("antiparallel magnetization") to the magnetization direction of the ferromagnetic source.

3. The transistor as claimed in claim 1, wherein the ferromagnetic source and the ferromagnetic drain are made of a ferromagnetic metal.

4. The transistor as claimed in claim 1, wherein, with a voltage not being applied between the gate electrode and the ferromagnetic source, the Schottky barrier restrains the spin-polarized conduction carriers from being injected to the semiconductor layer due to tunneling and heat radiation, the transistor being of the accumulation channel type.

5. The transistor as claimed in claim 1, wherein a voltage is applied to the gate electrode, so that the spin-polarized conduction carriers of the ferromagnetic source are injected to the semiconductor layer by tunneling the Schottky barrier at the interface between the ferromagnetic source and the semiconductor layer, the transistor being of the accumulation channel type.

6. The transistor as claimed in claim 1, wherein, with a voltage not being applied to the gate electrode, the Schottky barrier restrains the spin-polarized conduction carriers from being injected to the semiconductor layer due to heat radiation, while the spin-polarized conduction carriers of the ferromagnetic source are injected to the semiconductor layer by tunneling the Schottky barrier, the transistor being of the accumulation channel type.

7. The transistor as claimed in claim 1, wherein, with a voltage being applied to the gate electrode, the spin-polarized conduction carriers of the ferromagnetic source tunnels the Schottky barrier at the interface between the ferromagnetic source and the semiconductor layer, so as to control a current that is generated between the ferromagnetic source and the ferromagnetic drain, the transistor being of the accumulation channel type.

8. The transistor as claimed in claim 1, wherein the spin-polarized conduction carriers injected to the semiconductor layer are spin-polarized in accordance with the spin polarization rate at the Fermi energy of the ferromagnetic source, the transistor being of the accumulation channel type.

9. The transistor as claimed in claim 1, wherein:
when the relative magnetization state between the ferromagnetic source and the ferromagnetic drain is parallel magnetization, an electric resistance due to spin-dependent scattering of the spin-polarized conduction carriers injected from the ferromagnetic source is low in the ferromagnetic drain;
when the relative magnetization state between the ferromagnetic source and the ferromagnetic drain is antiparallel magnetization, the electric resistance due to spin-dependent scattering of the spin-polarized conduction carriers injected from the ferromagnetic source is high in the ferromagnetic drain,
the transistor being of the accumulation channel type.

10. The transistor as claimed in claim 1, wherein transconductance can be controlled in accordance with the relative magnetization direction of the ferromagnetic drain with respect to the ferromagnetic source, with the same bias being applied.

11. The transistor as claimed in claim 1, wherein, when the ferromagnetic source and the ferromagnetic drain exhibit parallel magnetization, the transistor has a threshold voltage that is defined as a gate voltage for generating a predetermined current between the ferromagnetic source and the ferromagnetic drain, with a voltage being applied to the gate electrode,
the transistor being of the accumulation channel type.

12. The transistor as claimed in claim 1, wherein the ferromagnetic source and the ferromagnetic drain are formed through growth or deposition on the semiconductor layer.

13. The transistor as claimed in claim 1, wherein the ferromagnetic source and the ferromagnetic drain are by introducing magnetic elements into the semiconductor layer.

14. A memory device comprising
the transistor as claimed in claim 1,
using the transistor, information being stored in accordance with the relative magnetization direction of the ferromagnetic drain with respect to the ferromagnetic source,
the information stored in the transistor being detected based on the transconductance of the transistor depending on the relative magnetization direction of the ferromagnetic drain with respect to the ferromagnetic source.

15. A memory device comprising:
the transistor as claimed in claim 1;
a first line that is connected to the gate electrode;
a second line that is connected to the ferromagnetic drain; and
a third line that grounds the ferromagnetic source.

16. A memory device comprising:
the transistor as claimed in claim 1;
a first line that is connected to the gate electrode;
a second line that is connected to the ferromagnetic drain;
a third line that grounds the ferromagnetic source;
an output terminal that is formed at one end of the second line; and
a fourth line that branches from the second line and is connected to a power source via a load.

17. The memory device as claimed in claim 15, further comprising
a first extra line and a second extra line that cross each other on the transistor or in the vicinity of the transistor, being electrically insulated.

18. The memory device as claimed in claim 15, wherein the first extra line and the second extra line, or one of the first extra line and the second extra line is replaced with the first line and the second line, or one of the first line and the second line.

19. The memory device as claimed in claim 17, wherein the magnetization of the ferromagnetic source or the ferromagnetic drain is inverted by a magnetic field that is induced by applying a current to the first extra line and the second extra line, or the first line and the second line that replace the first extra line and the second extra line, or one of the first line and the second line that replaces one of the first extra line and the second extra line and the other one of the first extra line and the second extra line that is not replaced, so that the relative magnetization state between the ferromagnetic source and the ferromagnetic drain is changed to rewrite information.

20. The memory device as claimed in claim 15, wherein:
when the ferromagnetic source and the ferromagnetic drain exhibit parallel magnetization, a voltage that is higher than the threshold voltage is applied to the first line; and
information is read out, based on the size of a drain current at the transistor when a predetermined bias is applied between the ferromagnetic source and the ferromagnetic drain.

21. The memory device as claimed in claim 16, wherein information is read out with an output voltage that is obtained based on a voltage drop due to the load caused by a drain current generated at the transistor when a voltage higher than the threshold voltage is applied to the gate electrode via the first line, the ferromagnetic source and the ferromagnetic drain exhibiting parallel magnetization.

22. A memory circuit comprising:
the transistors as claimed in claim 1, the transistors being arranged in a matrix fashion;
first lines that ground the respective ferromagnetic sources;
a plurality of word lines that connect the respective gate electrodes of the transistors that are arranged in the column direction; and
a plurality of bit lines that connect the respective ferromagnetic drains of the transistors that are arranged in the row direction.

23. A memory circuit comprising:
the transistors as claimed in claim 1, the transistors being arranged in a matrix fashion;
first lines that ground the respective ferromagnetic sources;
a plurality of word lines that connect the respective gate electrodes of the transistors that are arranged in the column direction;
a plurality of bit lines that connect the respective ferromagnetic drains of the transistors that are arranged in the row direction;
output terminals each formed at one end of each of the bit lines; and
second lines that branch from the respective bit lines and are connected to a power source via a load.

24. The memory circuit as claimed in claim 22, further comprising
a first extra line and a second extra line that crosses each other on each of the transistors or in the vicinity of each of the transistors, the first extra line and the second extra line being electrically insulated.

25. The memory circuit as claimed in claim 24, wherein the first extra line and the second extra line, or one of the first extra line and the second extra line is replaced with the corresponding word line and the corresponding bit line, or one of the corresponding word line and the corresponding bit line.

26. The memory circuit as claimed in claim 22, wherein the magnetization of the ferromagnetic source or the ferromagnetic drain is inverted by a magnetic field that is induced by applying a current to the first extra line and the second extra line, or the word line and the bit line that replace the first extra line and the second extra line, or one of the word line and the bit line that replaces one of the first extra line and the second extra line and the other one of the first extra line and the second extra line that is not replaced, so that the relative magnetization state between the ferromagnetic source and the ferromagnetic drain is changed to rewrite information.

27. The memory circuit as claimed in claim 22, wherein:
when the ferromagnetic source and the ferromagnetic drain exhibit parallel magnetization, a voltage that is higher than the threshold voltage is applied to the word line; and
information is read out, based on the size of a drain current at the transistor when a predetermined bias is applied between the ferromagnetic source and the ferromagnetic drain.

28. The memory circuit as claimed in claim 23, wherein information is read out with an output voltage that is obtained based on a voltage drop due to the load caused by a drain current generated at the transistor when a voltage higher than the threshold voltage is applied to the gate electrode via the word line, the ferromagnetic source and the ferromagnetic drain exhibiting parallel magnetization.

29. The memory device or the memory circuit as claimed in claim 15, wherein information is rewritten by inverting the magnetization of the ferromagnetic source or the ferromagnetic drain.

30. A memory device comprising:
first and second transistors that are as claimed in claim 1;
a first line that collectively connects the gate electrode of the first transistor and the gate electrode of the second transistor;
a second line that is connected to a first ferromagnetic drain of the first transistor;
a third line that is connected to a second ferromagnetic drain of the second transistor; and
a fourth line that grounds the ferromagnetic source that is shared between the first and second transistors.

31. A memory circuit comprising
memory cells that are formed with the memory devices as claimed in claim 30, the memory cells being arranged in a matrix fashion.

32. The transistor as claimed in claim 1, wherein the semiconductor layer is an undoped semiconductor or an intrinsic semiconductor.

33. The transistor as claimed in claim 1, wherein the semiconductor layer is an undoped semiconductor or an intrinsic semiconductor, the transistor being of the accumulation channel type.

34. The transistor as claimed in claim 1, wherein a channel length that is defined as the length in the carrier conducting direction in the semiconductor layer or the distance between the ferromagnetic source and the ferromagnetic drain is so short that the semiconductor layer can conduct carriers in a ballistic manner, or the channel length is equal to or shorter than the mean free path associated with carrier energy relaxation.

35. The transistor as claimed in claim 1, further comprising
a metal layer that forms a Schottky junction between the semiconductor layer and the metal layer, or a semiconductor layer that forms a Schottky junction between the ferromagnetic metal and the semiconductor layer, or a metal/semiconductor Schottky junction layer,
the metal layer, the semiconductor layer, or the metal/semiconductor Schottky layer being formed at the interface between the ferromagnetic metal and the semiconductor layer.

36. The transistor as claimed in claim 32, wherein, when the relative magnetization of the ferromagnetic drain with respect to the ferromagnetic source is antiparallel magnetization, the drain current is lower than the drain current in a case of parallel magnetization.

37. The transistor as claimed in claim 32, wherein transconductance can be controlled in accordance with the relative magnetization direction of the ferromagnetic drain with respect to the ferromagnetic source.

38. A memory device comprising
the transistor as claimed in claim 32,
using the transistor, information being stored in accordance with the relative magnetization direction of the ferromagnetic drain with respect to the ferromagnetic source,
the information stored in the transistor being detected based on the transconductance of the transistor depending on the relative magnetization direction of the ferromagnetic drain with respect to the ferromagnetic source.

39. The memory device as claimed in claim 14, wherein the semiconductor layer is an undoped semiconductor or an intrinsic semiconductor.

40. The memory circuit as claimed in claim 22, wherein the semiconductor layer is an undoped semiconductor or an intrinsic semiconductor.

41. The memory device as claimed in claim 14, wherein the a source and a drain that are of a first conduction type, and are formed with ferromagnetic semiconductors;
a semiconductor layer that is provided associated with the source and the drain, and has a channel of the first conduction type formed therein; and
a gate electrode that is formed as opposed to the semiconductor layer.

42. The memory circuit as claimed in claim 22, wherein the a source and a drain that are of a first conduction type, and are formed with ferromagnetic semiconductors;
a semiconductor layer that is provided associated with the source and the drain, and has a channel of the first conduction type formed therein; and
a gate electrode that is formed as opposed to the semiconductor layer.

43. The transistor as claimed in claim 1, wherein a gate insulating film formed between the gate electrode and the semiconductor layer is an insulator that is formed through oxidization or deposition.

44. The transistor as claimed in claim 43, wherein the gate insulating film contains a high dielectric constant material.

45. The transistor as claimed in claim 1, wherein the transistor is a MISFET.

46. The transistor as claimed in claim 1, wherein an impurity is added to the semiconductor layer, so that the transistor functions as a depletion-mode transistor.

47. A transistor comprising:
a ferromagnetic source that is formed with a ferromagnetic body from which spin-polarized conduction carriers are injected;
a ferromagnetic drain that is formed with a ferromagnetic body that receives the spin-polarized conduction carriers injected from the ferromagnetic source;
a semiconductor layer that is provided between the ferromagnetic source and the ferromagnetic drain, and forms a Schottky junction having a Schottky barrier at each junction interface with the ferromagnetic source and the ferromagnetic drain; and
a gate electrode that is formed associated with the semiconductor layer,
wherein the Schottky barrier appears on the valence band side when the spin-polarized conduction carriers are electrons, and the Schottky barrier appears on the conduction band side when the spin-polarized conduction carriers are holes, with the spin-polarized conduction carriers being of a different conduction type from that of the semiconductor layer (an inversion channel type), the semiconductor layer not having an inversion layer formed therein.

48. The transistor as claimed in claim 47, wherein, with a voltage not being applied between the gate electrode and the ferromagnetic source, the Schottky barrier restrains the spin-polarized conduction carriers from being injected to the semiconductor layer due to tunneling and heat radiation, the transistor being of the inversion channel type.

49. The transistor as claimed in claim 47, wherein a voltage is applied to the gate electrode to form an inversion layer in the semiconductor layer, so that the spin-polarized conduction carriers of the ferromagnetic source are injected to the semiconductor layer due to at least one of heat radiation and tunneling, the transistor being of the inversion channel type.

50. The transistor as claimed in claim 47, wherein, even with a voltage not being applied to the gate electrode, an inversion layer is formed in the semiconductor layer, and the spin-polarized conduction carriers of the ferromagnetic source are injected to the semiconductor layer due to at least one of heat radiation and tunneling, the transistor being of the inversion channel type.

51. The transistor as claimed in claim 47, wherein, with a voltage being applied to the gate electrode, the spin-polarized conduction carriers of the ferromagnetic source are injected from the ferromagnetic source to the semiconductor layer due to at least one of heat radiation and tunneling, so as to control a current generated between the ferromagnetic source and the ferromagnetic drain, the transistor being of the inversion channel type.

52. The transistor as claimed in claim 7, wherein the semiconductor layer is an undoped semiconductor or an intrinsic semiconductor, the transistor being of the inversion channel type.

* * * * *